US010476466B2

(12) United States Patent
Karino et al.

(10) Patent No.: US 10,476,466 B2
(45) Date of Patent: Nov. 12, 2019

(54) ELECTRONIC COMPONENT

(71) Applicant: MURATA MANUFACTURING CO., LTD., Kyoto-fu (JP)

(72) Inventors: Jun Karino, Nagaokakyo (JP); Mizuho Katsuta, Nagaokakyo (JP); Kosuke Ishida, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 148 days.

(21) Appl. No.: 15/297,382

(22) Filed: Oct. 19, 2016

(65) Prior Publication Data

US 2017/0125154 A1    May 4, 2017

(30) Foreign Application Priority Data

Nov. 4, 2015 (JP) .................................. 2015-216265

(51) Int. Cl.
*H01F 5/00* (2006.01)
*H03H 7/38* (2006.01)
*H01F 27/29* (2006.01)

(52) U.S. Cl.
CPC ............. *H03H 7/38* (2013.01); *H01F 27/292* (2013.01)

(58) Field of Classification Search
USPC ........................................ 336/200, 223, 232
See application file for complete search history.

(56) References Cited

U.S. PATENT DOCUMENTS

| 6,356,181 B1 * | 3/2002 | Kitamura | ............ H01F 17/0013 336/200 |
| 7,474,190 B2 * | 1/2009 | Strzalkowski | ...... H01F 27/2804 336/200 |
| 2005/0128042 A1 | 6/2005 | Tomohiro et al. | |

FOREIGN PATENT DOCUMENTS

| CN | 1627456 A | 6/2005 |
| JP | 2005175300 A | 6/2005 |
| JP | 4209851 A | 1/2009 |

OTHER PUBLICATIONS

Notification of the First Office Action issued by the State Intellectual Property Office of the People's Republic of China dated Mar. 5, 2018, which corresponds to Chinese Patent Application No. 201610972341.4 and is related to U.S. Appl. No. 15/297,382.

(Continued)

Primary Examiner — Ronald Hinson
(74) Attorney, Agent, or Firm — Studebaker & Brackett PC

(57) ABSTRACT

An electronic component includes a multilayer body constituted by insulator layers that are laminated in a laminating direction, a primary coil including one or more primary coil conductor layers, a secondary coil including one or more secondary coil conductor layers, and a tertiary coil including one or more tertiary coil conductor layers. The primary coil conductor layers, the secondary coil conductor layers, and the tertiary coil conductor layers are arrayed in the laminating direction. The primary coil, the secondary coil, and tertiary coil constitute a common mode filter, and intervals between two among the one or more primary coil conductor layers, the one or more secondary coil conductor layers, and the one or more tertiary coil conductor layers, every two of those being adjacent to each other in the laminating direction, are not even.

9 Claims, 17 Drawing Sheets

(56) References Cited

OTHER PUBLICATIONS

An Office Action; "Notification of Reasons for Refusal," Mailed by the Japanese Patent Office dated Jun. 26, 2018, which corresponds to Japanese Patent Application No. 2015-216265 and is related to U.S. Appl. No. 15/297,382; with English language translation.

* cited by examiner

ELECTRONIC COMPONENT

CROSS REFERENCE TO RELATED APPLICATIONS

This application claims benefit of priority to Japanese Patent Application 2015-216265 filed Nov. 4, 2015, the entire content of which is incorporated herein by reference.

TECHNICAL FIELD

The present disclosure relates to an electronic component including a common mode filter.

BACKGROUND

A common mode choke coil disclosed in Japanese Patent No. 4209851, for example, is known as one disclosure regarding related-art common mode filters. FIG. 12 is a sectional structural view of a common mode choke coil 510 disclosed in Japanese Patent No. 4209851.

The common mode choke coil 510 comprises a multilayer body 512 and coils 514, 516 and 518. In a plan view, the coils 514, 516 and 518 extend from the outer peripheral side toward the inner peripheral side in a substantially spiral shape while circling clockwise, and they are overlapped with one another. The coil 518 is sandwiched between the coils 514 and 516 from the upper and lower sides. In the common mode choke coil 510, a high frequency signal is transferred to each of the coils 514 and 516, and a ground potential is connected to the coil 518.

SUMMARY

The inventors of this application have conducted studies on the common mode choke coil 510 disclosed in Japanese Patent No. 4209851 for a technique of transferring a high frequency signal to each of the coils 514, 516 and 518, and removing common mode noise from the differential signal between two high frequency signals among those three high frequency signals. In that case, the common mode choke coil 510 is mounted to a circuit board described below. FIG. 13 is a plan view of a circuit board 600 to which the common mode choke coil 510 is to be mounted. FIG. 14 is a sectional structural view, taken along 14-14, of the circuit board 600 to which the common mode choke coil 510 is to be mounted.

The circuit board 600 includes a board body 602, signal lines 604, 606 and 608, and a ground conductor layer 610. The board body 602 is an insulating substrate in the form of a plate, and it has an upper surface and a bottom surface. The signal lines 604, 606 and 608 are substantially linear conductive layers that are disposed on the upper surface of the board body 602, and that extend parallel to one another. The ground conductor layer 610 is disposed on the bottom surface of the board body 602 in an overlapping relation to the signal lines 604, 606 and 608. Thus, the signal lines 604, 606 and 608 and the ground conductor layer 610 constitute a microstrip line structure.

When the common mode choke coil 510 is mounted to the above-described circuit board 600, the signal line 604 is connected to the coil 514, the signal line 606 is connected to the coil 518, and the signal line 608 is connected to the coil 516.

In the common mode choke coil 510 and the circuit board 600 disclosed in Japanese Patent No. 4209851, however, it is difficult to hold matching between a differential impedance between the coil 514 and the coil 516 and a differential impedance between the signal line 604 and the signal line 608.

In the common mode choke coil 510, a difference occurs in differential impedances between two coils among the coils 514, 516 and 518 as described below. As illustrated in FIG. 12, the coil 514 and the coil 518 are adjacently opposed to each other, and the coil 516 and the coil 518 are adjacently opposed to each other. On the other hand, because the coil 518 is present between the coil 514 and the coil 516, the coil 514 and the coil 516 are not adjacently opposed to each other and are spaced through a relatively large distance. Accordingly, a capacitance generated between the coil 514 and the coil 516 is smaller than that generated between the coil 514 and the coil 518 and that generated between the coil 516 and the coil 518. As a result, the differential impedance generated between the coil 514 and the coil 516 is larger than that generated between the coil 514 and the coil 518 and that generated between the coil 516 and the coil 518.

In the circuit board 600, a difference occurs in differential impedances between two signal lines among the signal lines 604, 606 and 608 as described below. As illustrated in FIG. 13, the signal line 604 and the signal line 606 are adjacent to each other, and the signal line 606 and the signal line 608 are adjacent to each other. On the other hand, because the signal line 606 is present between the signal line 604 and the signal line 608, the signal line 604 and the signal line 608 are not adjacent to each other and are spaced through a relatively large distance. Accordingly, a capacitance generated between the signal line 604 and the signal line 608 is smaller than that generated between the signal line 604 and the signal line 606 and that generated between the signal line 606 and the signal line 608. As a result, the differential impedance generated between the signal line 604 and the signal line 608 is larger than that generated between the signal line 604 and the signal line 606 and that generated between the signal line 606 and the signal line 608.

The following description is made, for example, in connection with an example in which the differential impedance between the coil 514 and the coil 518 and the differential impedance between the coil 516 and the coil 518 are matched respectively with the differential impedance between the signal line 604 and the signal line 606 and the differential impedance between the signal line 606 and the signal line 608. In that case, the differential impedance between the coil 514 and the coil 516 is larger than that between the signal line 604 and the signal line 608. Accordingly, an adjustment of the differential impedance is required to reduce reflection between the common mode choke coil 510 and the circuit board 600.

On the other hand, because the signal lines 604, 606 and 608 are opposed to each other at their lateral surfaces between two adjacent lateral surfaces an area in which the adjacent signal lines are opposed to each other is small and a small capacitance is generated between the adjacent signal lines. Accordingly, an adjustable range of the differential impedances between two signal lines among the signal lines 604, 606 and 608 to be adjusted is relatively small, and the adjustment in the circuit board 600 is comparatively difficult.

Furthermore, in the circuit board 600, the signal lines 604, 606 and 608 are two-dimensionally arranged in the same layer. One conceivable solution for relatively increasing the adjustable range of the differential impedances between two signal lines among the signal lines 604, 606 and 608 is to three-dimensionally arrange the signal lines 604, 606 and 608 in different layers. However, such a solution is impractical because of an increased manufacturing cost of the circuit board 600. Thus, the adjustment in the common mode choke coil 510, the adjustment of the differential impedance between the coils 514 and 516 for example, is demanded.

Accordingly, an object of the present disclosure is, in an electronic component including a common mode filter constituted by three coils, to adjust differential impedances between two coils among the coils.

An electronic component according to one embodiment of the present disclosure comprises a multilayer body constituted by insulator layers that are laminated in a laminating direction, a primary coil including one or more primary coil conductor layers each disposed on one of the insulator layers, a secondary coil including one or more secondary coil conductor layers each disposed on one of the insulator layers, and a tertiary coil including one or more tertiary coil conductor layers each disposed on one of the insulator layers, wherein the primary coil conductor layers, the secondary coil conductor layers, and the tertiary coil conductor layers are arrayed in the laminating direction, the primary coil, the secondary coil and tertiary coil constitute a common mode filter, and intervals between two among the one or more primary coil conductor layers, the one or more secondary coil conductor layers, and the one or more tertiary coil conductor layers, every two of those two being adjacent to each other in the laminating direction, are not even.

With the one embodiment of the present disclosure, in the electronic component including the common mode filter constituted by three coils, differential impedances between two coils among the three coils can be adjusted.

Other features, elements, characteristics and advantages of the present disclosure will become more apparent from the following detailed description of some embodiments of the present disclosure with reference to the attached drawings.

DETAILED DESCRIPTION

Electronic components according to some embodiments of the present disclosure will be described below.
(Configuration of Electronic Component)

Figure 1:
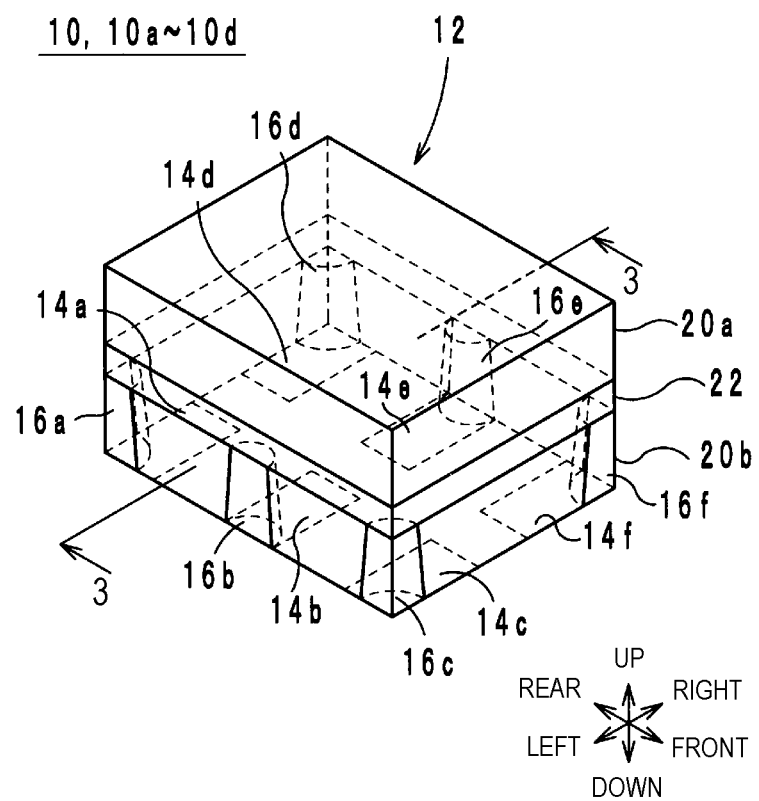
FIG. 1 is an external perspective view of each of electronic components according to an embodiment of the present disclosure and according to first to fourth modifications.
Figure 2:
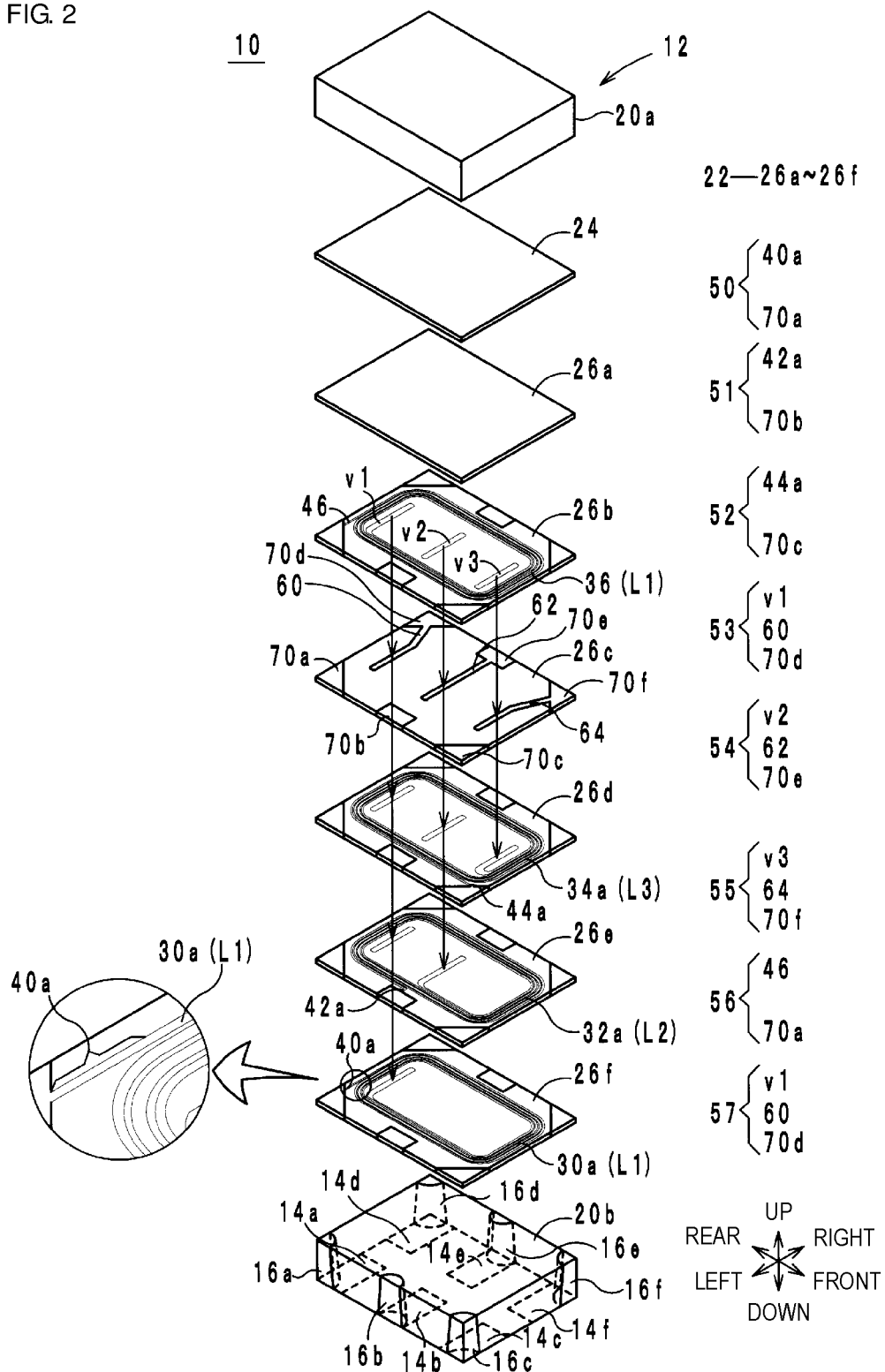
FIG. 2 is an exploded perspective view of the electronic component, illustrated in FIG. 1, according to the embodiment.
Figure 3:
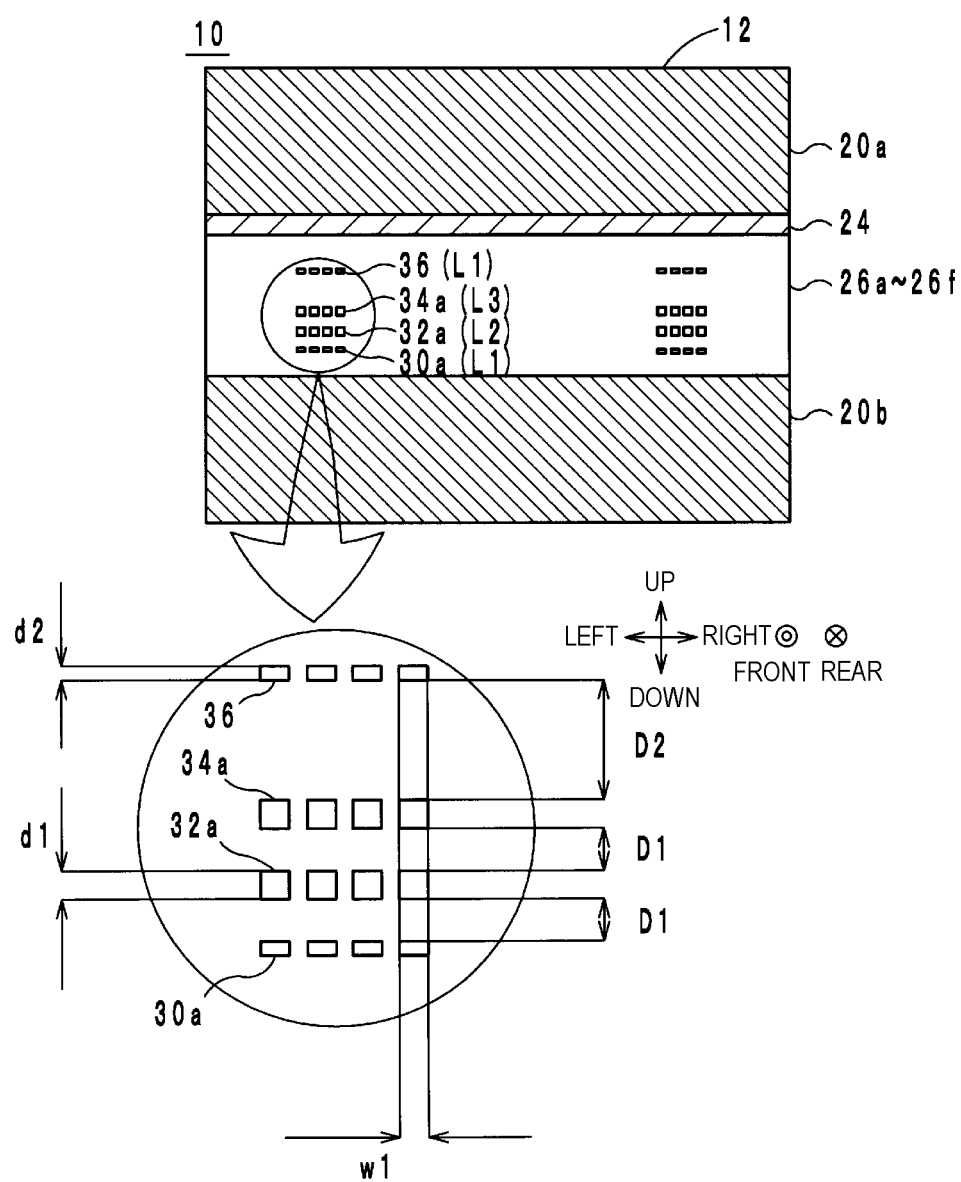
FIG. 3 is a sectional structural view, taken along 3-3, of the electronic component, illustrated in FIG. 1, according to the embodiment.

First, a configuration of an electronic component 10 according to one embodiment of the present disclosure is described with reference to the drawings. FIG. 1 is an external perspective view of each of electronic components 10 and 10a to 10d. FIG. 2 is an exploded perspective view of the electronic component 10 illustrated in FIG. 1. FIG. 3 is a sectional structural view, taken along 3-3, of the electronic component 10 illustrated in FIG. 1. In the following description, an up-down direction is a laminating direction of the electronic component 10, a front-back direction is a direction in which a long side of the electronic component 10 extends in a plan view, and a left-right direction is a direction in which a short side of the electronic component 10 extends in the plan view. The up-down direction, the front-back direction, and the left-right direction are orthogonal to one another. The laminating direction represents a direction in which later-described insulator layers are laminated, a direction orthogonal to a principal surface of insulator layers on which insulator layers are laminated to be more specific. The plan view is one viewed from the laminating direction, for example, a view when viewed from above. A lower side and an upper side is one example of one side and other side in the laminating direction.

As illustrated in FIGS. 1 to 3, the electronic component 10 includes a main body 12, outer electrodes 14a to 14f, connecting portions 16a to 16f, lead-out portions 50 to 57, a primary coil L1, a secondary coil L2, and a tertiary coil L3.

As illustrated in FIGS. 1 and 2, the main body 12 has a substantially rectangular parallelepiped shape, and includes magnetic substrates 20a and 20b, a multilayer body 22, and a magnetic layer 24. The magnetic substrate 20a, the magnetic layer 24, the multilayer body 22, and the magnetic substrate 20b are successively laminated in the mentioned order from the lower side toward the upper side.

The magnetic substrates 20a and 20b are each a plate-like member having a substantially rectangular shape in the plan view. In the following, a principal surface of each of the magnetic substrates 20a and 20b on the upper side is called an upper surface, and a principal surface of each of the magnetic substrates 20a and 20b on the lower side is called a bottom surface. The magnetic substrate 20b is partly cut out at four corners and the middle of two long sides thereof in the plan view. More specifically, a cutout having a substantially sector shape with a central angle of about 90 degrees in the plan view is formed at each of the four corners of the magnetic substrate 20b. A cutout having a substantially semicircular shape in the plan view is formed at the middle of each of the two long sides of the magnetic substrate 20b. Those six cutouts extend along lateral surfaces of the magnetic substrate 20b in the up-down direction from the upper surface of the magnetic substrate 20b until reaching the bottom surface thereof.

The magnetic substrates 20a and 20b are each fabricated by cutting a sintered ferrite ceramic. Alternatively, the magnetic substrates 20a and 20b may be each fabricated by coating a paste, which is made of calcined ferrite powder and a binder, over a ceramic substrate made of, e.g., alumina, or by laminating green sheets each made of a ferrite material, and firing the laminated green sheets.

The outer electrodes 14a to 14f are disposed on the bottom surface of the magnetic substrate 20b, and each outer electrode has a substantially rectangular shape. More specifically, the outer electrode 14a is disposed at a rear left corner of the bottom surface of the magnetic substrate 20b. The outer electrode 14b is disposed at the middle of a long side of the bottom surface of the magnetic substrate 20b on the left side. The outer electrode 14c is disposed at a front left corner of the bottom surface of the magnetic substrate 20b. Thus, the outer electrodes 14a, 14b and 14c are arrayed to position in the mentioned order from the rear side toward the front side. The outer electrode 14d (one example of a first outer electrode) is disposed at a rear right corner of the bottom surface of the magnetic substrate 20b. The outer electrode 14e (one example of a second outer electrode) is disposed at the middle of a long side of the bottom surface of the magnetic substrate 20b on the right side. The outer electrode 14f (one example of a third outer electrode) is disposed at a front right corner of the bottom surface of the magnetic substrate 20b. Thus, the outer electrodes 14d, 14e and 14f are arrayed to position in the mentioned order in a direction (one example of a predetermined direction) toward the front side from the rear side. The outer electrodes 14a to 14f are each fabricated by forming an Au film, a Ni film, a Cu film, and a Ti film in a laminated state with sputtering. Alternatively, the outer electrodes 14a to 14f may be each fabricated by applying and firing a paste that contains a metal such as Ag or Cu, or by forming a film of, e.g., Ag or Cu with evaporation or plating.

The connecting portions 16a to 16f are disposed respectively in the six cutouts formed in the magnetic substrate 20b. The connecting portion 16a is disposed in the cutout positioned at a rear left corner of the magnetic substrate 20b and is connected at its lower end to the outer electrode 14a. The connecting portion 16b is disposed in the cutout positioned at the middle of a long side of the magnetic substrate 20b on the left side and is connected at its lower end to the outer electrode 14b. The connecting portion 16c is disposed in the cutout positioned at a front left corner of the magnetic substrate 20b and is connected at its lower end to the outer electrode 14c. The connecting portion 16d is disposed in the cutout positioned at a rear right corner of the magnetic substrate 20b and is connected at its lower end to the outer electrode 14d. The connecting portion 16e is disposed in the cutout positioned at the middle of a long side of the magnetic substrate 20b on the right side and is connected at its lower end to the outer electrode 14e. The connecting portion 16f is disposed in the cutout positioned at a front right corner of the magnetic substrate 20b and is connected at its lower end to the outer electrode 14f. The connecting portions 16a to 16f are each fabricated by forming a conductor film, which contains Cu as a main ingredient, with plating. Alternatively, the connecting portions 16a to 16f may be each fabricated using a material with high electrical conductivity, such as Ag or Au.

The multilayer body 22 includes insulator layers 26a to 26f (one example of a plurality of insulator layers) that are laminated on the upper surface of the magnetic substrate 20b, and it has a substantially rectangular shape in the plan view. The insulator layers 26a to 26f are laminated to array in the mentioned order from the upper side toward the lower side, and they have substantially the same size as the upper surface of the magnetic substrate 20b. Four corners and the middle of two long sides of each of the insulator layers 26b to 26f are cut out in the plan view.

The insulator layers 26a to 26f are each made of polyimide. Alternatively, the insulator layers 26a to 26f may be each made of an insulating resin such as benzocyclobutene, or made of an insulating inorganic material such as glass-ceramic. In the following, a principal surface of each of the insulator layers 26a to 26f on the upper side is called an upper surface, and a principal surface of each of the insulator layers 26a to 26f on the lower side is called a bottom surface.

The magnetic layer 24 is disposed between the multilayer body 22 and the magnetic substrate 20a, and it serves to not only planarize an upper surface of the multilayer body 22, but also join the multilayer body 22 and the magnetic substrate 20a to each other. The magnetic layer 24 is made of, e.g., a mixture of powder of a magnetic material and resin.

The primary coil L1 is disposed inside the multilayer body 22 and includes a coil conductor layer 30a, one example of a primary coil conductor layer. The coil conductor layer 30a is disposed on the upper surface of the insulator layer 26f, and it has a substantially spiral shape extending from the outer peripheral side toward the inner peripheral side while circling clockwise in the plan view. In this embodiment, the coil conductor layer 30a has a length corresponding to about four times the circumference of the spiral shape. The center of the coil conductor layer 30a is substantially aligned with the center (crossed point of diagonal lines) of the electronic component 10 in the plan view.

The lead-out portion 50 connects one end of the primary coil L1 (i.e., an end portion of the coil conductor layer 30a on the outer peripheral side) to the outer electrode 14a, and it does not have the substantially spiral shape in the plan view, as illustrated in FIG. 2. The lead-out portion 50 includes a lead-out conductor layer 40a and a connecting conductor 70a. The connecting conductor 70a is a conductor having a substantially triangular prism shape and disposed at the rear left corners of the insulator layers 26b to 26f. In FIG. 2, for the sake of easier understanding, the connecting conductor 70a is illustrated in a state divided into five pieces. Similarly to the connecting conductor 70a, later-described connecting conductors 70b to 70f are also each illustrated in a state divided into five pieces. The connecting conductor 70a extends in the up-down direction from the upper surface of the insulator layer 26b to the bottom surface of the insulator layer 26f, and is connected at its lower end to the connecting portion 16a.

The lead-out conductor layer 40a is disposed on the upper surface of the insulator layer 26f, and is connected to the outer end portion of the coil conductor layer 30a and further to the connecting conductor 70a. The lead-out conductor layer 40a does not have the substantially spiral shape in the plan view, and it extends leftward from the outer end portion of the coil conductor layer 30a. As illustrated in an enlarged view in FIG. 2, a boundary between the coil conductor layer 30a and the lead-out conductor layer 40a is at a position where the lead-out conductor layer 40a departs from the locus of the substantially spiral shape formed by the coil conductor layer 30a. With such an arrangement, the one end of the primary coil L1 (i.e., the outer end portion of the coil conductor layer 30a) and the outer electrode 14a are connected to each other through the lead-out portion 50 (including the lead-out conductor layer 40a and the connecting conductor 70a) and the connecting portion 16a.

The lead-out portion 53 connects the other end of the primary coil L1 (i.e., an inner end portion of the coil conductor layer 30a) to the outer electrode 14d, and it does not have the substantially spiral shape in the plan view, as illustrated in FIG. 2. The lead-out portion 53 includes an interlayer connecting conductor v1, a lead-out conductor layer 60, and a connecting conductor 70d. The connecting conductor 70d is a conductor having a substantially triangular prism shape and disposed at the rear right corners of the insulator layers 26b to 26f. The connecting conductor 70d extends in the up-down direction from the upper surface of the insulator layer 26b to the bottom surface of the insulator layer 26f, and is connected at its lower end to the connecting portion 16d.

The interlayer connecting conductor v1 is a conductor penetrating through the insulator layers 26b to 26f in the up-down direction, and it has a substantially linear shape extending in the left-right direction in the plan view. The interlayer connecting conductor v1 is disposed in rear half regions of the insulator layers 26b to 26f in the plan view, and is connected to the end portion of the coil conductor layer 30a on the inner peripheral side.

The lead-out conductor layer 60, one example of a first lead-out conductor layer, is disposed on the upper surface of the insulator layer 26c, and it does not have the substantially spiral shape in the plan view. The lead-out conductor layer 60 relays connection between the inner end portion of the coil conductor layer 30a, one example of an end primary coil conductor layer, and the outer electrode 14d. More specifically, the lead-out conductor layer 60 is connected to the interlayer connecting conductor v1 and further to the connecting conductor 70d. With such an arrangement, the other end of the primary coil L1 (i.e., the inner end portion of the coil conductor layer 30a) and the outer electrode 14d are connected to each other through the lead-out portion 53 (including the interlayer connecting conductor v1, the lead-out conductor layer 60, and the connecting conductor 70d) and the connecting portion 16d.

The secondary coil L2 is disposed inside the multilayer body 22 and includes the coil conductor layer 32a, one example of a secondary coil conductor layer. The coil conductor layer 32a is disposed on the upper surface of the insulator layer 26e, and it has a substantially spiral shape extending from the outer peripheral side toward the inner peripheral side while circling clockwise in the plan view. In this embodiment, the coil conductor layer 32a has a length corresponding to about four times the circumference of the spiral shape. The center of the coil conductor layer 32a is substantially aligned with the center (crossed point of the diagonal lines) of the electronic component 10 in the plan view.

As illustrated in FIGS. 2 and 3, the coil conductor layer 32a overlaps the coil conductor layer 30a substantially over the entire length in the plan view. Therefore, a region surrounded by the coil conductor layer 30a (i.e., an inner magnetic path of the primary coil L1) and a region surrounded by the coil conductor layer 32a (i.e., an inner magnetic path of the secondary coil L2) overlap with each other in the plan view. Thus, the coil conductor layer 30a (i.e., the primary coil L1) and the coil conductor layer 32a (i.e., the secondary coil L2) are magnetically coupled to each other. However, positions of both ends of the coil conductor layer 30a and positions of both ends of the coil conductor layer 32a are set to be different such that the lead-out portions 50 and 53 and the later-described lead-out portions 51 and 54 do not interfere with each other. More specifically, the end portion of the coil conductor layer 32a on the outer peripheral side is positioned upstream of the end portion of the coil conductor layer 30a on the outer peripheral side in the clockwise direction. The end portion of the coil conductor layer 32a on the inner peripheral side is positioned upstream of the end portion of the coil conductor layer 30a on the inner peripheral side in the clockwise direction. With such an arrangement, the length of the coil conductor layer 30a and the length of the coil conductor layer 32a are substantially equal to each other. Since the coil conductor layer 30a and the coil conductor layer 32a are just required to be magnetically coupled, they are not always required to overlap with each other over the entire length, and they may be slightly deviated in the front-back direction or the left-right direction. In other words, it is just required that the coil conductor layer 32a is disposed on the upper side of the coil conductor layer 30a.

The lead-out portion 51 connects one end of the secondary coil L2 (i.e., an outer end portion of the coil conductor layer 32a) to the outer electrode 14b, and it does not have the substantially spiral shape in the plan view, as illustrated in FIG. 2. The lead-out portion 51 includes a lead-out conductor layer 42a and a connecting conductor 70b. The connecting conductor 70b is a conductor having a substantially quadrangular prism shape and disposed at the middle of the long sides of the insulator layers 26b to 26f on the left side. The connecting conductor 70b extends in the up-down direction from the upper surface of the insulator layer 26b to the bottom surface of the insulator layer 26f, and is connected at its lower end to the connecting portion 16b.

The lead-out conductor layer 42a is disposed on the upper surface of the insulator layer 26e, and is connected to the outer end portion of the coil conductor layer 32a and further to the connecting conductor 70b. The lead-out conductor layer 42a does not have the substantially spiral shape in the plan view, and it extends leftward from the outer end portion of the coil conductor layer 32a. With such an arrangement, the one end of the secondary coil L2 (i.e., the outer end portion of the coil conductor layer 32a) and the outer electrode 14b are connected to each other through the lead-out portion 51 (including the lead-out conductor layer 42a and the connecting conductor 70b) and the connecting portion 16b.

The lead-out portion 54 connects the other end of the secondary coil L2 (i.e., an inner end portion of the coil conductor layer 32a) to the outer electrode 14e, and it does not have the substantially spiral shape in the plan view, as illustrated in FIG. 2. The lead-out portion 54 includes an interlayer connecting conductor v2, a lead-out conductor layer 62, and a connecting conductor 70e. The connecting conductor 70e is a conductor having a substantially quadrangular prism shape and disposed at the middle of the long sides of the insulator layers 26b to 26f on the right side. The connecting conductor 70e extends in the up-down direction from the upper surface of the insulator layer 26b to the bottom surface of the insulator layer 26f, and is connected at its lower end to the connecting portion 16e.

The interlayer connecting conductor v2 is a conductor penetrating through the insulator layers 26b to 26e in the up-down direction, and it has a substantially linear shape extending in the left-right direction in the plan view. The interlayer connecting conductor v2 is disposed in central regions of the insulator layers 26b to 26e in the plan view, and is connected to the end portion of the coil conductor layer 32a on the inner peripheral side.

The lead-out conductor layer 62, one example of a second lead-out conductor layer, is disposed on the upper surface of the insulator layer 26c, and it does not have the substantially spiral shape in the plan view. The lead-out conductor layer 62 relays connection between the inner end portion of the coil conductor layer 32a, one example of an end secondary coil conductor layer, and the outer electrode 14e. More specifically, the lead-out conductor layer 62 is connected to the interlayer connecting conductor v2 and further to the connecting conductor 70e. With such an arrangement, the other end of the secondary coil L2 (i.e., the inner end portion of the coil conductor layer 32a) and the outer electrode 14e are connected to each other through the lead-out portion 54 (including the interlayer connecting conductor v2, the lead-out conductor layer 62, and the connecting conductor 70e) and the connecting portion 16e.

The tertiary coil L3 is disposed inside the multilayer body 22 and includes the coil conductor layer 34a, one example of a tertiary coil conductor layer. The coil conductor layer 34a is disposed on the upper surface of the insulator layer 26d, and it has a substantially spiral shape extending from the outer peripheral side toward the inner peripheral side while circling clockwise in the plan view. In this embodiment, the coil conductor layer 34a has a length corresponding to about four times the circumference of the spiral shape. The center of the coil conductor layer 34a is substantially aligned with the center (crossed point of the diagonal lines) of the electronic component 10 in the plan view.

As illustrated in FIGS. 2 and 3, the coil conductor layer 34a overlaps the coil conductor layers 30a and 32a substantially over the entire length in the plan view. Therefore, the region surrounded by the coil conductor layer 30a (i.e., the inner magnetic path of the primary coil L1), the region surrounded by the coil conductor layer 32a (i.e., the inner magnetic path of the secondary coil L2), and a region surrounded by the coil conductor layer 34a (i.e., an inner magnetic path of the tertiary coil L3) overlap with one another in the plan view. Thus, the coil conductor layer 30a (i.e., the primary coil L1), the coil conductor layer 32a (i.e., the secondary coil L2), and the coil conductor layer 34a (i.e., the tertiary coil L3) are magnetically coupled to one another. However, the positions of both the ends of the coil conductor layer 30a, the positions of both the ends of the coil conductor layer 32a, and positions of both ends of the coil conductor layer 34a are set to be different such that the lead-out portions 50 and 53, the lead-out portions 51 and 54, and later-described lead-out portions 52 and 55 do not interfere with one another. More specifically, the end portion of the coil conductor layer 34a on the outer peripheral side is positioned upstream of the end portions of the coil conductor layers 30a and 32a on the outer peripheral side in the clockwise direction. The end portion of the coil conductor layer 34a on the inner peripheral side is positioned upstream of the end portions of the coil conductor layers 30a and 32a on the inner peripheral side in the clockwise direction. With such an arrangement, the length of the coil conductor layer 30a, the length of the coil conductor layer 32a, and the length of the coil conductor layer 34a are substantially equal to one another. Since the coil conductor layer 30a, the coil conductor layer 32a, and the coil conductor layer 34a are just required to be magnetically coupled, they are not always required to overlap with one another over the entire length, and they may be slightly deviated in the front-back direction or the left-right direction. In other words, it is just required that the coil conductor layer 34a is disposed on the upper side of the coil conductor layers 30a and 32a.

The lead-out portion 52 connects one end of the tertiary coil L3 (i.e., an outer end portion of the coil conductor layer 34a) to the outer electrode 14c, and it does not have the substantially spiral shape in the plan view, as illustrated in FIG. 2. The lead-out portion 52 includes a lead-out conductor layer 44a and a connecting conductor 70c. The connecting conductor 70c is a conductor having a substantially triangular prism shape and disposed at the front left corners of the insulator layers 26b to 26f. The connecting conductor 70c extends in the up-down direction from the upper surface of the insulator layer 26b to the bottom surface of the insulator layer 26f, and is connected at its lower end to the connecting portion 16c.

The lead-out conductor layer 44a is disposed on the upper surface of the insulator layer 26d, and is connected to the outer end portion of the coil conductor layer 34a and further to the connecting conductor 70c. The lead-out conductor layer 44a does not have the substantially spiral shape in the plan view, and it extends forward from the outer end portion of the coil conductor layer 34a. With such an arrangement, the one end of the tertiary coil L3 (i.e., the outer end portion of the coil conductor layer 34a) and the outer electrode 14c are connected to each other through the lead-out portion 52 (including the lead-out conductor layer 44a and the connecting conductor 70c) and the connecting portion 16c.

The lead-out portion 55 connects the other end of the tertiary coil L3 (i.e., an inner end portion of the coil conductor layer 34a) to the outer electrode 14f, and it does not have the substantially spiral shape in the plan view, as illustrated in FIG. 2. The lead-out portion 55 includes an interlayer connecting conductor v3, a lead-out conductor layer 64, and a connecting conductor 70f. The connecting conductor 70f is a conductor having a substantially triangular prism shape and disposed at the front right corners of the insulator layers 26b to 26f. The connecting conductor 70f extends in the up-down direction from the upper surface of the insulator layer 26b to the bottom surface of the insulator layer 26f, and is connected at its lower end to the connecting portion 16f.

The interlayer connecting conductor v3 is a conductor penetrating through the insulator layers 26b to 26d in the up-down direction, and it has a substantially linear shape extending in the left-right direction in the plan view. The interlayer connecting conductor v3 is disposed in front half regions of the insulator layers 26b to 26d in the plan view, and is connected to the end portion of the coil conductor layer 34a on the inner peripheral side.

The lead-out conductor layer 64, one example of a third lead-out conductor layer, is disposed on the upper surface of the insulator layer 26c, and it does not have the substantially spiral shape in the plan view. The lead-out conductor layer 64 relays connection between the inner end portion of the coil conductor layer 34a, one example of an end tertiary coil conductor layer, and the outer electrode 14f. More specifically, the lead-out conductor layer 64 is connected to the interlayer connecting conductor v3 and further to the connecting conductor 70f. With such an arrangement, the other end of the tertiary coil L3 (i.e., the inner end portion of the coil conductor layer 34a) and the outer electrode 14f are connected to each other through the lead-out portion 55

(including the interlayer connecting conductor v3, the lead-out conductor layer 64, and the connecting conductor 70*f*) and the connecting portion 16*f*.

The primary coil L1 further includes a parallel coil conductor layer 36, one example of a parallel primary coil conductor layer. The parallel coil conductor layer 36 has the same shape as the coil conductor layer 30*a*, one example of a predetermined primary coil conductor layer. The parallel coil conductor layer 36 is electrically connected to the coil conductor layer 30*a* in parallel, and is disposed on the upper side of the coil conductor layer 34*a*, one example of a predetermined tertiary coil conductor layer, which is the coil conductor layer disposed at an uppermost position among the coil conductor layers 30*a*, 32*a* and 34*a*. In other words, the parallel coil conductor layer 36 is disposed on the upper surface of the insulator layer 26*b*, and is positioned above the coil conductor layer 34*a* and the lead-out conductor layers 60, 62 and 64. Furthermore, the parallel coil conductor layer 36 has a substantially spiral shape extending from the outer peripheral side toward the inner peripheral side while circling clockwise in the plan view as the coil conductor layer 30*a*. In this embodiment, the parallel coil conductor layer 36 has a length corresponding to about four times the circumference of the spiral shape. The center of the parallel coil conductor layer 36 is substantially aligned with the center (crossed point of the diagonal lines) of the electronic component 10 in the plan view.

The lead-out portion 56 connects an outer end portion of the parallel coil conductor layer 36 to the outer electrode 14*a*, and it does not have the substantially spiral shape in the plan view, as illustrated in FIG. 2. The lead-out portion 56 includes a lead-out conductor layer 46 and the connecting conductor 70*a*. The lead-out conductor layer 46 is disposed on the upper surface of the insulator layer 26*b*, and is connected to the outer end portion of the parallel coil conductor layer 36 and further to the connecting conductor 70*a*. The lead-out conductor layer 46 does not have the substantially spiral shape in the plan view, and it extends leftward from the outer end portion of the parallel coil conductor layer 36. With such an arrangement, the outer end portion of the parallel coil conductor layer 36 and the outer electrode 14*a* are connected to each other through the lead-out portion 56 (including the lead-out conductor layer 46 and the connecting conductor 70*a*) and the connecting portion 16*a*.

The lead-out portion 57 connects the inner end portion of the parallel coil conductor layer 36 to the outer electrode 14*d*, and it does not have the substantially spiral shape in the plan view, as illustrated in FIG. 2. The lead-out portion 57 includes the interlayer connecting conductor v1, the lead-out conductor layer 60, and the connecting conductor 70*d*. Because the interlayer connecting conductor v1, the lead-out conductor layer 60, and the connecting conductor 70*d* have already been described above, further description of those members is omitted here. With the above-mentioned arrangement, the inner end portion of the parallel coil conductor layer 36 and the outer electrode 14*d* are connected to each other through the lead-out portion 57 (including the interlayer connecting conductor v1, the lead-out conductor layer 60, and the connecting conductor 70*d*) and the connecting portion 16*d*. Thus, the parallel coil conductor layer 36 is electrically connected to the coil conductor layer 30*a* in parallel.

The coil conductor layers 30*a*, 32*a* and 34*a*, the parallel coil conductor layer 36, the lead-out conductor layer 40*a*, 42*a*, 44*a*, 46, 60, 62 and 64, and the connecting conductors 70*a* to 70*f* are each formed by coating a film with sputtering of Ag. Alternatively, the coil conductor layers 30*a*, 32*a* and 34*a*, the parallel coil conductor layer 36, the lead-out conductor layer 40*a*, 42*a*, 44*a*, 46, 60, 62 and 64, and the connecting conductors 70*a* to 70*f* may be formed using another material with high electrical conductivity, such as Cu or Au.

As described above, in the primary coil L1, the coil conductor layer 30*a* and the parallel coil conductor layer 36 have a substantially same shape, and they are electrically connected in parallel. Moreover, the length of the coil conductor layer 30*a*, the length of the coil conductor layer 32*a*, the length of the coil conductor layer 34*a*, and the length of the parallel coil conductor layer 36 are substantially equal to one another. Therefore, current paths of the primary coil L1, the secondary coil L2, and the tertiary coil L3 are substantially equal to one another in length. The expression "current paths are substantially equal in length" implies that slight differences among the lengths of the coil conductor layers 30*a*, 32*a*, 34*a* and 36 are regarded to be not substantial, those slight differences being generated by arranging the positions of the lead-out conductor layer 40*a*, 42*a*, 44*a* and 46 and the interlayer connecting conductors v1 to v3 so as not to interfere with one another.

Moreover, the coil conductor layers 30*a*, 32*a* and 34*a* and the parallel coil conductor layer 36 are constituted such that a total of a sectional area of the coil conductor layer 30*a* and a sectional area of the parallel coil conductor layer 36 is substantially equal to a sectional area of the coil conductor layer 32*a* and a sectional area of the coil conductor layer 34*a*. More specifically, as illustrated in FIG. 3, a line width of the coil conductor layer 30*a*, a line width of the coil conductor layer 32*a*, a line width of the coil conductor layer 34*a*, and a line width of the parallel coil conductor layer 36 are substantially equal to one another as denoted by a line width w1. However, each of the coil conductor layers 32*a* and 34*a* has a thickness d1, and each of the coil conductor layer 30*a* and the parallel coil conductor layer 36 has a thickness d2. The thickness d2 is about half of the thickness d1. Thus, the respective sectional areas of the coil conductor layer 30*a* and the parallel coil conductor layer 36 are substantially equal to each other and are each about half the sectional area of each of the coil conductor layers 32*a* and 34*a*. Accordingly, the total of the sectional area of the coil conductor layer 30*a* and the sectional area of the parallel coil conductor layer 36 is substantially equal to the sectional area of the coil conductor layer 32*a* and the sectional area of the coil conductor layer 34*a*. On that condition, a resistance value of each of the coil conductor layer 30*a* and the parallel coil conductor layer 36 is about twice that of each of the coil conductor layers 32*a* and 34*a*. In this respect, the coil conductor layer 30*a* and the parallel coil conductor layer 36 are electrically connected in parallel. Thus, in the current paths of the primary coil L1, the secondary coil L2, and the tertiary coil L3, a sectional area of the primary coil L1, a sectional area of the secondary coil L2, and a sectional area of the tertiary coil L3 are substantially equal to one another. As a result, the resistance value of the primary coil L1, the resistance value of the secondary coil L2, and the resistance value of the tertiary coil L3 are substantially equal to one another.

The sectional area of the coil conductor layer in the above description is defined as a sectional area taken in a section of the coil conductor layer perpendicular to a direction in which the coil conductor layer extends lengthwise. The thickness of the coil conductor layer is defined as a thickness of the coil conductor layer in the up-down direction. The line width of the coil conductor layer is defined as a width of the section of the coil conductor layer perpendicular to the extending direction of the coil conductor layer, the width being taken in a direction perpendicular to the up-down direction of the coil conductor layer.

Furthermore, an interval D1 between the two coil conductor layers 30a and 32a adjacent to each other in the up-down direction and an interval D1 between the two coil conductor layers 32a and 34a adjacent to each other in the up-down direction are substantially equal to each other. In other words, the intervals between two coil conductor layers among the coil conductor layers 30a, 32a and 34a, every two of those being adjacent to each other in the up-down direction, are substantially the even. However, an interval D2 between the coil conductor layers 34a and the parallel coil conductor layer 36 is larger than the interval D1 between the coil conductor layer 30a and the coil conductor layer 32a and the interval D1 between the coil conductor layer 32a and the coil conductor layer 34a. The reason resides in that the lead-out conductor layers 60, 62 and 64 are disposed between the parallel coil conductor layer 36 and the coil conductor layer 34a in the up-down direction. Thus, in the electronic component 10, the intervals between two among the coil conductor layers 30a, 32a and 34a and the parallel coil conductor layer 36, every two of those being adjacent to each other in the up-down direction, are not even. Here, the interval between the coil conductor layers is defined as a distance between opposing surfaces of the two adjacent coil conductor layers. The expression "the intervals are not even" is not limited to the case where all the intervals are different, and it implies that at least one of the intervals may be different from the remaining distances. In such a case, the remaining distances may be all the same.

An operation of the electronic component 10 having the above configuration will be described below. The outer electrodes 14a to 14c are used as input terminals for example. The outer electrodes 14d to 14f are used as output terminals for example. The primary coil L1, the secondary coil L2, and the tertiary coil L3 are magnetically coupled.

A first signal S1, a second signal S2, and a third signal S3 are input respectively to the outer electrodes 14a, 14b and 14c. The first signal S1, the second signal S2, and the third signal S3 are assumed to be provided as follows. The first signal S1, the second signal S2, and the third signal S3 take three different arbitrary voltage values of high (H), middle (M) and low (L), and they transit among the three values H, M and L at the same clock. Furthermore, at the timing when one signal takes the value H, one of the remaining two signals takes the value M, and the other signal takes the value L. In other words, the first signal S1, the second signal S2, and the third signal S3 exclusively transit among the three values H, M and L. In that case, a total of the voltage values of the first signal S1, the second signal S2, and the third signal S3 is substantially always constant at (H+M+L), and a "total" change amount of the voltages due to the transition is almost zero (0). Accordingly, a "total" change amount of currents generated in the primary coil L1, the secondary coil L2, and the tertiary coil L3 is also almost zero (0), and a change amount of magnetic fluxes generated in the electronic component 10 is almost zero "0" (although magnetic flux generated in each of the primary coil L1, the secondary coil L2, and the tertiary coil L3 changes, the changes of the magnetic fluxes cancel each other). When there is substantially no change of the magnetic flux as described above, any impedance is substantially not generated in the electronic component 10, and hence the electronic component 10 does not cause any influence upon the first signal S1, the second signal S2, and the third signal S3.

On the other hand, with respect to common mode noise, i.e., in-phase noise contained in the first signal S1, the second signal S2, and the third signal S3, magnetic fluxes generated in the primary coil L1, the secondary coil L2, and the tertiary coil L3 are changed in the same direction, and the changes of the magnetic fluxes do not cancel each other. Therefore, the electronic component 10 exhibits a large impedance for the common mode noise. Hence the common mode noise can be reduced in the electronic component 10. As described above, the primary coil L1, the secondary coil L2, and the tertiary coil L3 constitute a common mode filter, and the electronic component 10 can reduce the common mode noise without affecting the first signal S1, the second signal S2, and the third signal S3. Thus, the electronic component 10 functions as the common mode filter for the first signal S1, the second signal S2, and the third signal S3.

(Manufacturing Method for Electronic Component)

A manufacturing method for the electronic component 10 will be described below with reference to the drawings. The following description is made in connection with an example in which one electronic component 10 is manufactured. In practice, however, the plurality of electronic components 10 are formed at the same time by laminating mother magnetic substrates and mother insulator layers, each having a large size, to fabricate a mother body, and by cutting the mother body into a plurality of pieces.

First, a photosensitive resin, e.g., a polyimide resin, is coated over the entire upper surface of the magnetic substrate 20b. Then, the polyimide resin is exposed in a state blocked off against light with a photoresist at positions corresponding to the four corners and the middle of the two long sides of the insulator layer 26f. As a result, the polyimide resin in a region having been not blocked off against light is solidified. After removing the photoresist with an organic solvent, the polyimide resin is developed to remove the not-solidified polyimide resin and to thermally-solidify the remaining polyimide resin. As a result, the insulator layer 26f is formed.

Next, an Ag film is formed on the insulator layer 26f and on the magnetic substrate 20b, which is exposed from the insulator layer 26f, by sputtering. Then, a photoresist is formed on regions where the coil conductor layer 30a, the lead-out conductor layer 40a, the connecting conductors 70a to 70f, and the interlayer connecting conductor v1 are to be formed. Then, the Ag film is removed by etching from a region except for the regions where the coil conductor layer 30a, the lead-out conductor layer 40a, the connecting conductors 70a to 70f, and the interlayer connecting conductor v1 are to be formed (i.e., except for the regions covered with the photoresist). Thereafter, the photoresist is removed with an organic solvent, thus forming the coil conductor layer 30a, the lead-out conductor layer 40a, respective one parts (corresponding to one layer) of the connecting conductors 70a to 70f, and the interlayer connecting conductor v1.

The insulator layers 26a to 26e, the coil conductor layers 32a and 34a, the parallel coil conductor layer 36, the lead-out conductor layers 42a, 44a, 46, 60, 62 and 64, respective remaining parts of the connecting conductors 70a to 70f, and the interlayer connecting conductor v2 and v3 are formed by repeating similar steps to those described above.

Next, a magnetic paste becoming the magnetic layer 24 is coated over the multilayer body 22, and the magnetic substrate 20a is pressure-bonded onto the magnetic layer 24.

Next, the six cutouts are formed in the magnetic substrate 20b by sand blasting. Those cutouts may be formed by laser processing instead of the sand blasting, or by a combination of the sand blasting and the laser processing.

Finally, conductor layers are formed on inner peripheral surfaces of the cutouts of the magnetic substrate 20b with a combination of electrolytic plating and photolithography, whereby the connecting portions 16a to 16f and the outer electrodes 14a to 14f are formed.

(Advantageous Effects)

With the electronic component 10 according to this embodiment, when the electronic component 10 is mounted to the circuit board 600, a differential impedance between the tertiary coil L3 and the primary coil L1 (hereinafter referred to as a differential impedance I31) can be matched with a differential impedance between the signal line 604 and the signal line 608. The following description is made in connection with an example in which the primary coil L1 is connected to the signal line 604, the secondary coil L2 is connected to the signal line 606, and the tertiary coil L3 is connected to the signal line 608.

In the electronic component 10, the parallel coil conductor layer 36 is disposed. With the provision of the parallel coil conductor layer 36, the differential impedance I31 is made closer to a differential impedance between the primary coil L1 and the secondary coil L2 (hereinafter referred to as a differential impedance I12) and a differential impedance between the secondary coil L2 and the tertiary coil L3 (hereinafter referred to as a differential impedance I23). In addition, the interval D2 between the coil conductor layer 34a and the parallel coil conductor layer 36 is larger than the interval D1 between the coil conductor layer 30a and the coil conductor layer 32a and the interval D1 between the coil conductor layer 32a and the coil conductor layer 34a. Thus, the differential impedance I31 is slightly larger than each of the differential impedances I12 and I23. As a result, impedance matching is held between the differential impedance I31 and the differential impedance between the signal line 604 and the signal line 608. That point will be described in more detail below.

Assuming that an inductance value of the entire electronic component 10 including the coils is denoted by L and a capacitance value thereof is denoted by C when a measurement current (or a differential signal) flows through the electronic component, the differential impedance is expressed by root of L/C. C includes capacitances between the coil conductor layers (i.e., parasitic capacitances). In the current paths of the primary coil L1, the secondary coil L2, and the tertiary coil L3 in the electronic component 10, the sectional area of the primary coil L1, the sectional area of the secondary coil L2, and the sectional area of the tertiary coil L3 are substantially equal to one another. Furthermore, current paths of the primary coil L1, the secondary coil L2, and the tertiary coil L3 are substantially equal to one another in length and substantially equal in turn numbers. As a result, inductance values of the primary coil L1, the secondary coil L2, and the tertiary coil L3 are substantially equal to one another.

In the electronic component 10, the parallel coil conductor layer 36 is disposed on the upper side of the coil conductor layer 34a that is disposed at the uppermost position among the coil conductor layers 30a, 32a and 34a. With such a layout, a capacitance is generated between the coil conductor layer 34a and the parallel coil conductor layer 36. A capacitance between the primary coil L1 and the secondary coil L2 is formed mainly by the capacitance between the coil conductor layer 30a and the coil conductor layer 32a. A capacitance between the secondary coil L2 and the tertiary coil L3 is formed mainly by the capacitance between the coil conductor layer 32a and the coil conductor layer 34a. A capacitance between the tertiary coil L3 and the primary coil L1 is formed mainly by the capacitance between the parallel coil conductor layer 36 and the coil conductor layer 34a. Thus, C values can be made closer among the differential impedances I12, I23 and I31. As a result, the differential impedances I12, I23 and I31 come closer to one another.

However, the differential impedance between the signal line 604 and the signal line 608 is larger than the differential impedance between the signal line 604 and the signal line 606 and the differential impedance between the signal line 606 and the signal line 608. Accordingly, when the differential impedance I12 is made matched with the differential impedance between the signal line 604 and the signal line 606 and the differential impedance I23 is made matched with the differential impedance between the signal line 606 and the signal line 608, the differential impedance I31 becomes smaller than the differential impedance between the signal line 604 and the signal line 608. In such a case, there is a possibility that, due to mismatching between the differential impedance I31 and the differential impedance between the signal line 604 and the signal line 608, a high frequency signal may be reflected and a waveform of the high frequency signal may be distorted. Accordingly, in order to hold matching between the differential impedance I31 and the differential impedance between the signal line 604 and the signal line 608, it is preferable in some cases to adjust the differential impedance I31 such that the differential impedance I31 is slightly larger than the differential impedance I12 and the differential impedance I23.

In the electronic component 10, the interval D2 between the coil conductor layer 34a and the parallel coil conductor layer 36 is larger than the interval D1 between the coil conductor layer 30a and the coil conductor layer 32a and the interval D1 between the coil conductor layer 32a and the coil conductor layer 34a. Therefore, the capacitance generated between the tertiary coil L3 and the primary coil L1 becomes smaller than the capacitance generated between the primary coil L1 and the secondary coil L2 and the capacitance generated between the secondary coil L2 and the tertiary coil L3. Thus, the differential impedance I31 becomes slightly larger than each of the differential impedances I12 and I23. As a result, impedance matching is held between the differential impedance I31 and the differential impedance between the signal line 604 and the signal line 608.

Moreover, in the electronic component 10, degradation of Sdd21 in a high frequency band is suppressed. "Sdd21" implies bandpass characteristics of a differential mode signal. In the following description, Sdd21 between the primary coil L1 and the secondary coil L2 is called bandpass characteristics S12, Sdd21 between the secondary coil L2 and the tertiary coil L3 is called bandpass characteristics S23, and Sdd21 between the tertiary coil L3 and the primary coil L1 is called bandpass characteristics S31.

In the electronic component 10, the provision of the parallel coil conductor layer 36 increases the capacitance generated between the tertiary coil L3 and the primary coil L1 in comparison with an electronic component in which the parallel coil conductor layer 36 is not disposed. If the capacitance generated between the tertiary coil L3 and the primary coil L1 increases, the bandpass characteristics S31 may degrade.

To cope with the above point, in the electronic component 10, the interval D2 between the coil conductor layer 34a and the parallel coil conductor layer 36 is set larger than the interval D1 between the coil conductor layer 30a and the coil conductor layer 32a and the interval D1 between the coil conductor layer 32a and the coil conductor layer 34a.

Therefore, the capacitance generated between the tertiary coil L3 and the primary coil L1 becomes smaller than the capacitance generated between the primary coil L1 and the secondary coil L2 and the capacitance generated between the secondary coil L2 and the tertiary coil L3. As a result, the degradation of the bandpass characteristics S31 is suppressed.

Moreover, according to the electronic component 10, as described above, in the current paths of the primary coil L1, the secondary coil L2, and the tertiary coil L3, the sectional area of the primary coil L1, the sectional area of the secondary coil L2, and the sectional area of the tertiary coil L3 are substantially equal to one another. As a result, the resistance value of the primary coil L1, the resistance value of the secondary coil L2, and the resistance value of the tertiary coil L3 are substantially equal to one another. Thus, respective values of currents flowing through the primary coil L1, the secondary coil L2, and the tertiary coil L3 can be made closer to one another, and respective amounts of heat generated from the primary coil L1, the secondary coil L2, and the tertiary coil L3 can also be made closer to one another.

When the resistance value of the primary coil L1, the resistance value of the secondary coil L2, and the resistance value of the tertiary coil L3 are substantially equal to one another, directivity of the electronic component 10 is eliminated. This implies that the outer electrodes 14a to 14c may be used as the input terminals and the outer electrodes 14d to 14f may be used as the output terminals, or that the outer electrodes 14a to 14c may be used as the output terminals and the outer electrodes 14d to 14f may be used as the input terminals. As a result, in the electronic component 10, it is no longer required to identify the orientation of the electronic component when it is mounted, and to attach an orientation identification mark.

According to the electronic component 10, an amount of heat generated from the coil conductor layer 30a can be made closer to that generated from the parallel coil conductor layer 36. To explain in more detail, the sectional area of the coil conductor layer 30a is substantially equal to that of the parallel coil conductor layer 36. In addition, the length of the coil conductor layer 30a is substantially equal to that of the parallel coil conductor layer 36. Therefore, the resistance value of the coil conductor layer 30a is substantially equal to that of the parallel coil conductor layer 36. Moreover, since the coil conductor layer 30a and the parallel coil conductor layer 36 are electrically connected in parallel, voltages applied to the coil conductor layer 30a and the parallel coil conductor layer 36 are substantially equal to each other, and currents flowing through the coil conductor layer 30a and the parallel coil conductor layer 36 are also substantially equal to each other. Hence the amount of heat generated from the coil conductor layer 30a can be made closer to that generated from the parallel coil conductor layer 36.

According to the electronic component 10, the interval D1 between the two coil conductor layers 30a and 32a adjacent in the up-down direction, and the interval D1 between the two coil conductor layer 32a and 34a adjacent in the up-down direction are substantially equal to each other. Therefore, conditions in laminating the coil conductor layers 30a, 32a and 34a can be made uniform, and reliability of the electronic component 10 can be improved. In addition, since the coil conductor layers 30a, 32a and 34a can be formed under the same conditions, manufacturing steps are rationalized.

According to the electronic component 10, a return loss can be reduced. To explain in more detail, in the circuit board 600, a combination of the signal lines, which increases the differential impedance therebetween, is the combination of the signal line 604 and the signal line 608. The signal line 604 and the signal line 608 are arranged on both sides of the signal line 606. On the other hand, in the electronic component 10, coils for which the differential impedance is to be adjusted are the primary coil L1 and the tertiary coil L3. Therefore, the electronic component 10 is preferably constituted such that the signal line 604 can be easily connected to the primary coil L1 and the signal line 608 can be easily connected to the tertiary coil L3. In consideration of the above point, the outer electrode 14d connected to the primary coil L1, the outer electrode 14e connected to the secondary coil L2, and the outer electrode 14f connected to the tertiary coil L3 are arrayed to position in the mentioned order from the rear side toward the front side. In other words, the outer electrodes 14d and 14f are arranged on both sides of the outer electrode 14e. Thus, the differential impedance between the primary coil L1 and the tertiary coil L3 can be adjusted to be matched with the differential impedance between the signal line 604 and the signal line 608. As a result, the return loss can be reduced in the electronic component 10.

The inventors of this application conducted computer simulations, described below, with intent to clarify that the differential impedance I31 can be adjusted to a proper level in the electronic component 10. To explain in more detail, a model having the same structure as the electronic component 10 was fabricated as a first model according to the embodiment. A model not including the parallel coil conductor layer 36 in the electronic component 10 was fabricated as a second model according to a comparative example. The differential impedances I12, I23 and I31 were computed for each of the first model and the second model. The computation was executed such that, when computing the differential impedance I12, for example, a differential signal was input to each of the primary coil L1 and the secondary coil L2, and the tertiary coil L3 was terminated at 50Ω relative to a ground potential.

Figure 4:
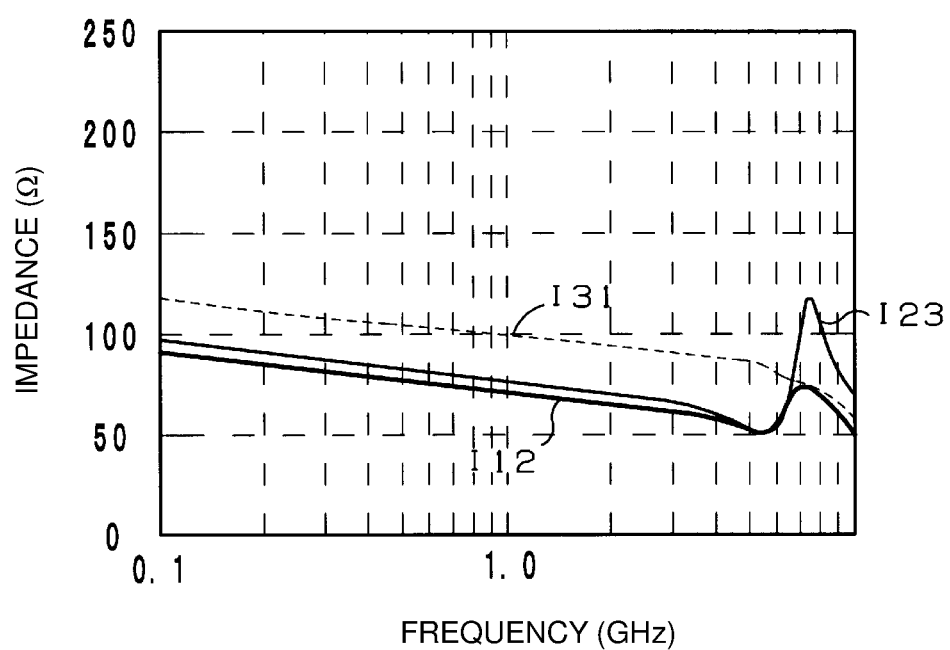
FIG. 4 is a graph representing a simulation result of a first model.
Figure 5:
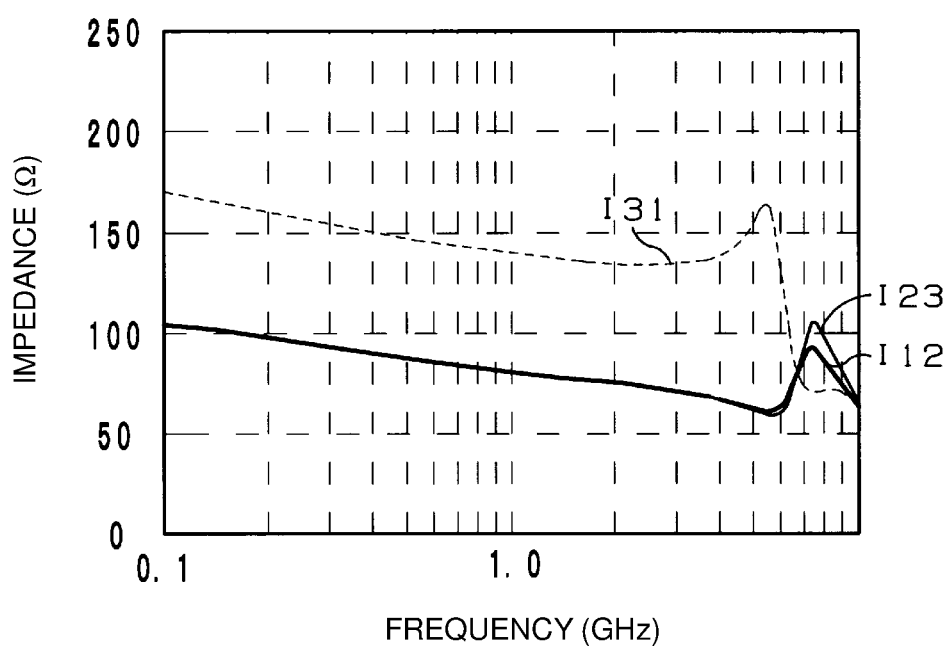
FIG. 5 is a graph representing a simulation result of a second model.

FIG. 4 is a graph representing a simulation result of the first model. FIG. 5 is a graph representing a simulation result of the second model. In FIGS. 4 and 5, the vertical axis indicates differential impedance, and the horizontal axis indicates frequency.

As seen from FIG. 5, in the second model, the differential impedance I31 is much larger than the differential impedances I12 and I23. At 1 GHz, for example, the differential impedance I31 is 145Ω, whereas the differential impedances I12 and I23 are each 85Ω.

On the other hand, as seen from FIG. 4, in the first model, the differential impedance I31 is slightly larger than the differential impedances I12 and I23. At 1 GHz, for example, the differential impedance I31 is 100Ω, whereas the differential impedances I12 and I23 are each 75Ω. It is hence understood that, in the electronic component 10, the differential impedance I31 can be adjusted to a proper level.

The inventors of this application further conducted computer simulations, described below, with intent to clarify that the degradation of Sdd21 in the high frequency band can be suppressed in the electronic component 10. To explain in more detail, the bandpass characteristics S12, S23 and S31 were computed for each of the first model and the second model. The computation was executed such that, when computing the bandpass characteristics S12, for example, a differential signal was input to each of the primary coil L1 and the secondary coil L2, and the tertiary coil L3 was terminated at 50Ω relative to a ground potential.

Figure 6A:
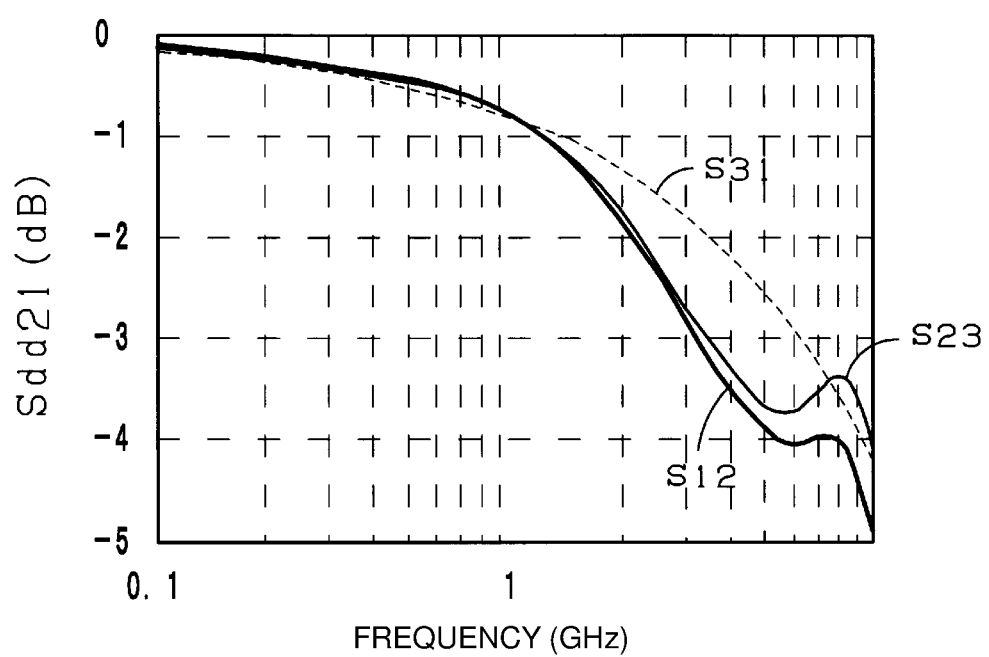
FIG. 6A is a graph representing a simulation result of the first model.
Figure 6B:
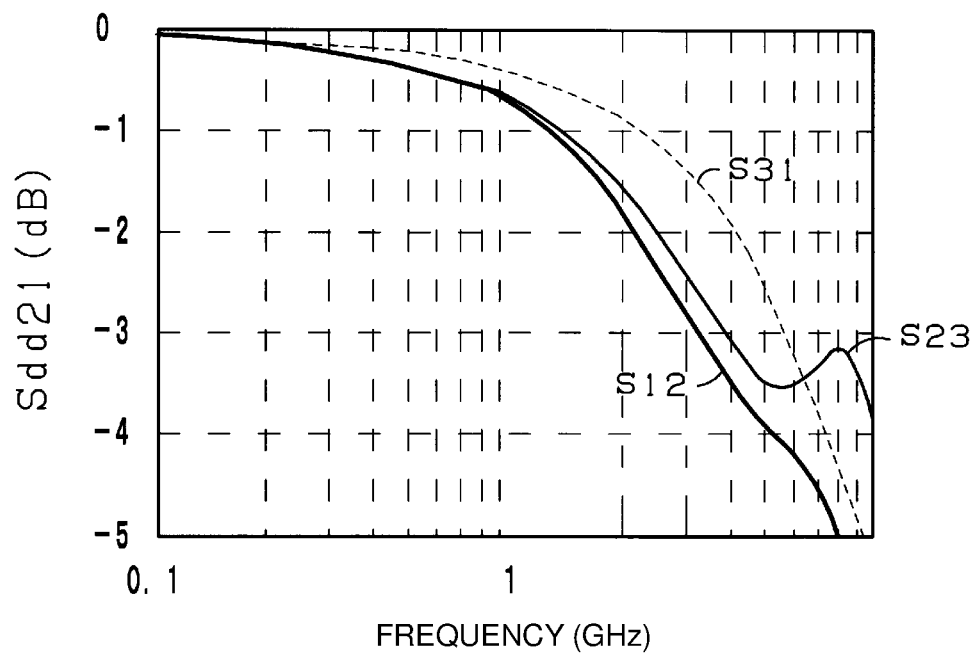
FIG. 6B is a graph representing a simulation result of the second model.

FIG. 6A is a graph representing a simulation result of the first model. FIG. 6B is a graph representing a simulation result of the second model. In FIGS. 6A and 6B, the vertical axis indicates bandpass characteristics, and the horizontal axis indicates frequency.

As seen from comparing FIGS. 6A and 6B, comparatively close results are obtained for both S31 of the first model and S31 of the second model. It is hence understood that the degradation of Sdd21 (particularly the bandpass characteristics S31) in a high frequency band can be suppressed in the electronic component 10 according to this embodiment.

(First Modification)

Figure 7A:
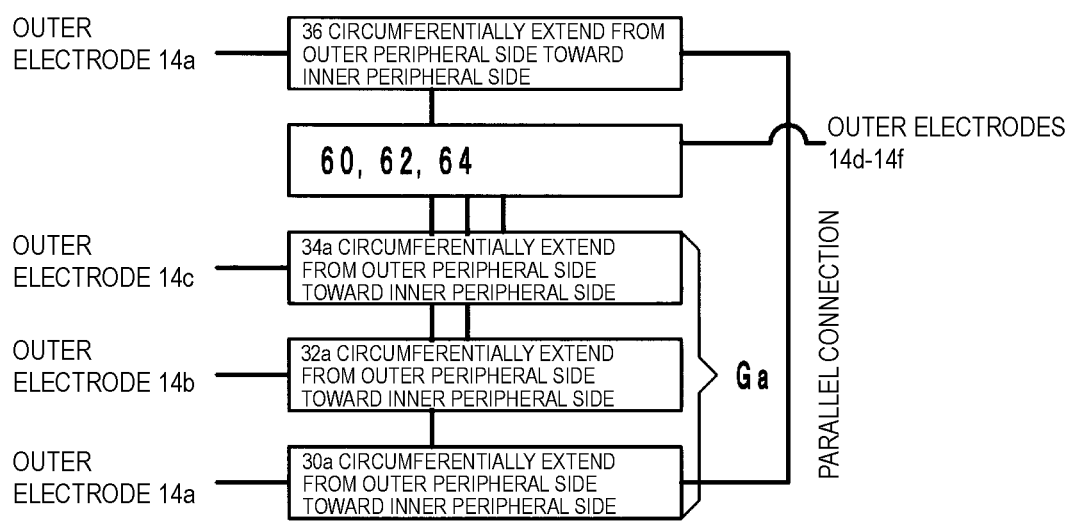
FIG. 7A is a schematic view illustrating a positional relation among coil conductor layers and a parallel coil conductor layer of the electronic component according to the embodiment.
Figure 7B:
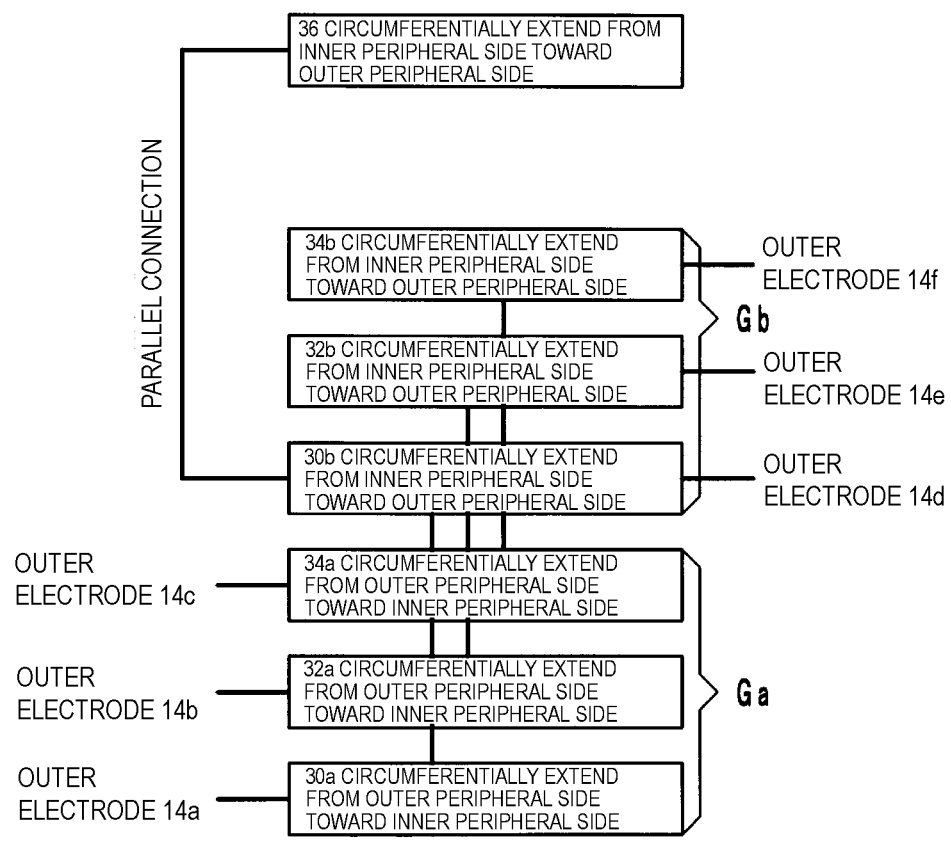
FIG. 7B is a schematic view illustrating a positional relationship among coil conductor layers and a parallel coil conductor layer of the electronic component according to the first modification.

A configuration of an electronic component 10a according to a first modification will be described below with reference to the drawings. FIG. 7A is a schematic view illustrating a positional relationship among the coil conductor layers 30a, 32a and 34a and the parallel coil conductor layer 36 of the electronic component 10. FIG. 7B is a schematic view illustrating a positional relationship among coil conductor layers 30a, 32a, 34a, 30b, 32b and 34b and a parallel coil conductor layer 36 of the electronic component 10a.

In the electronic component 10, the primary coil L1 includes one coil conductor layer 30a and one parallel coil conductor layer 36, the secondary coil L2 includes one coil conductor layer 32a, and the tertiary coil L3 includes one coil conductor layer 34a. On the other hand, in the electronic component 10a, the primary coil L1 includes two coil conductor layers 30a and 30b and one parallel coil conductor layer 36, the secondary coil L2 includes two coil conductor layers 32a and 32b, and the tertiary coil L3 includes two coil conductor layers 34a and 34b. Thus, the electronic component 10 and the electronic component 10a are different from each other in arrangement of the coil conductor layers 30a, 32a, 34a, 30b, 32b and 34b and the parallel coil conductor layer 36, as described below.

In the electronic component 10, as illustrated in FIG. 7A, one coil conductor layer 30a, one coil conductor layer 32a, and one coil conductor layer 34a are arrayed in the mentioned order from the lower side toward the upper side and constitute a coil conductor layer group Ga. The parallel coil conductor layer has the same shape as the coil conductor layer 30a. The parallel coil conductor layer 36 is electrically connected to the coil conductor layer 30a in parallel and is disposed on the upper side of the coil conductor layer 34a that is disposed at the uppermost position.

On the other hand, in the electronic component 10a, as illustrated in FIG. 7B, one coil conductor layer group Ga is constituted by one coil conductor layer 30a, one coil conductor layer 32a, and one coil conductor layer 34a, which are arrayed in the mentioned order from the lower side toward the upper side. One coil conductor layer 30b, one coil conductor layer 32b, and one coil conductor layer 34b are arrayed in the mentioned order from the lower side toward the upper side and constitute another coil conductor layer group Gb. The coil conductor layer groups Ga and Gb are arrayed in the mentioned order from the lower side toward the upper side. The parallel coil conductor layer 36 has the same shape as the coil conductor layer 30b. The parallel coil conductor layer 36 is electrically connected to the coil conductor layer 30b in parallel and is disposed on the upper side of the coil conductor layer 34b that is disposed at the uppermost position.

Figure 8A:
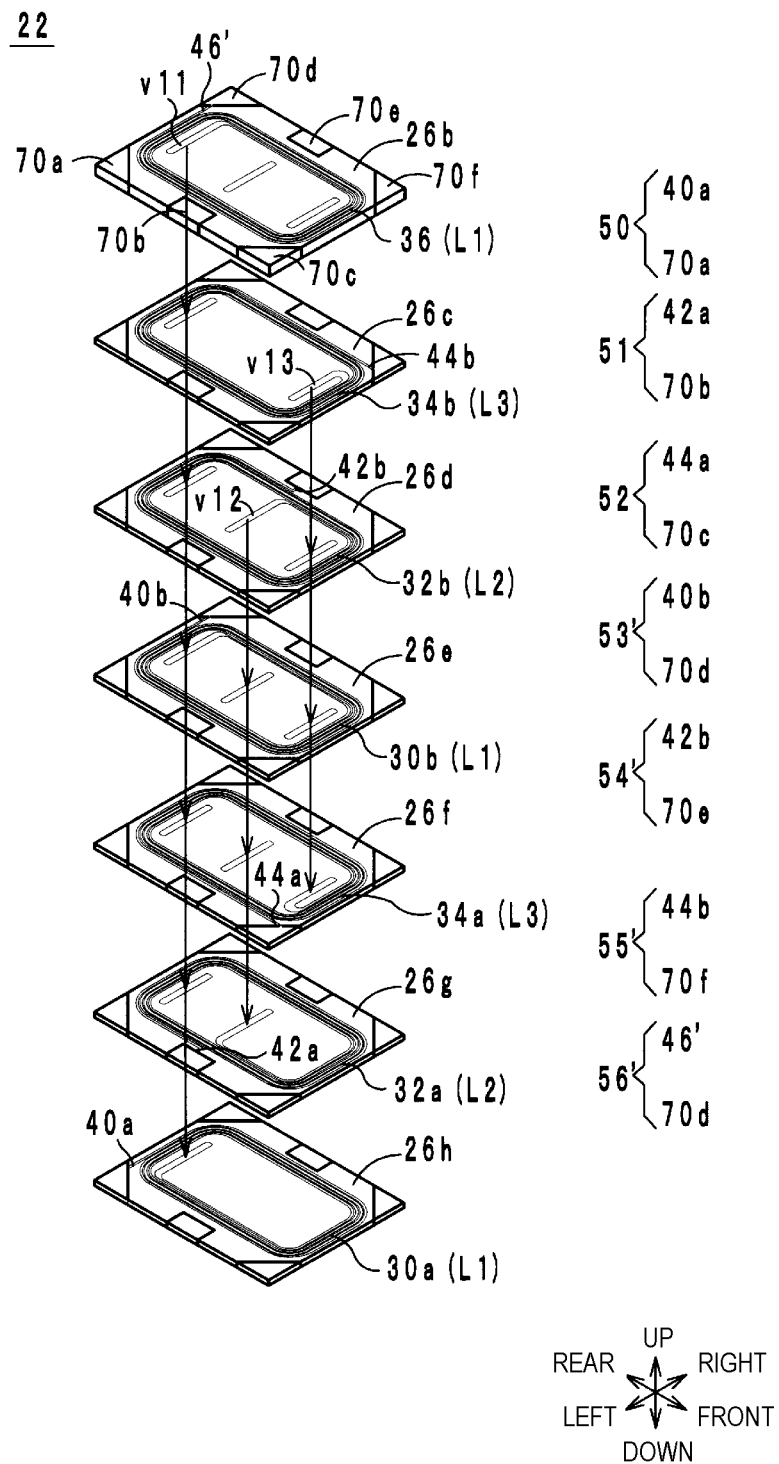
FIG. 8A is an exploded perspective view of a multilayer body of the electronic component according to the first modification.
Figure 8B:
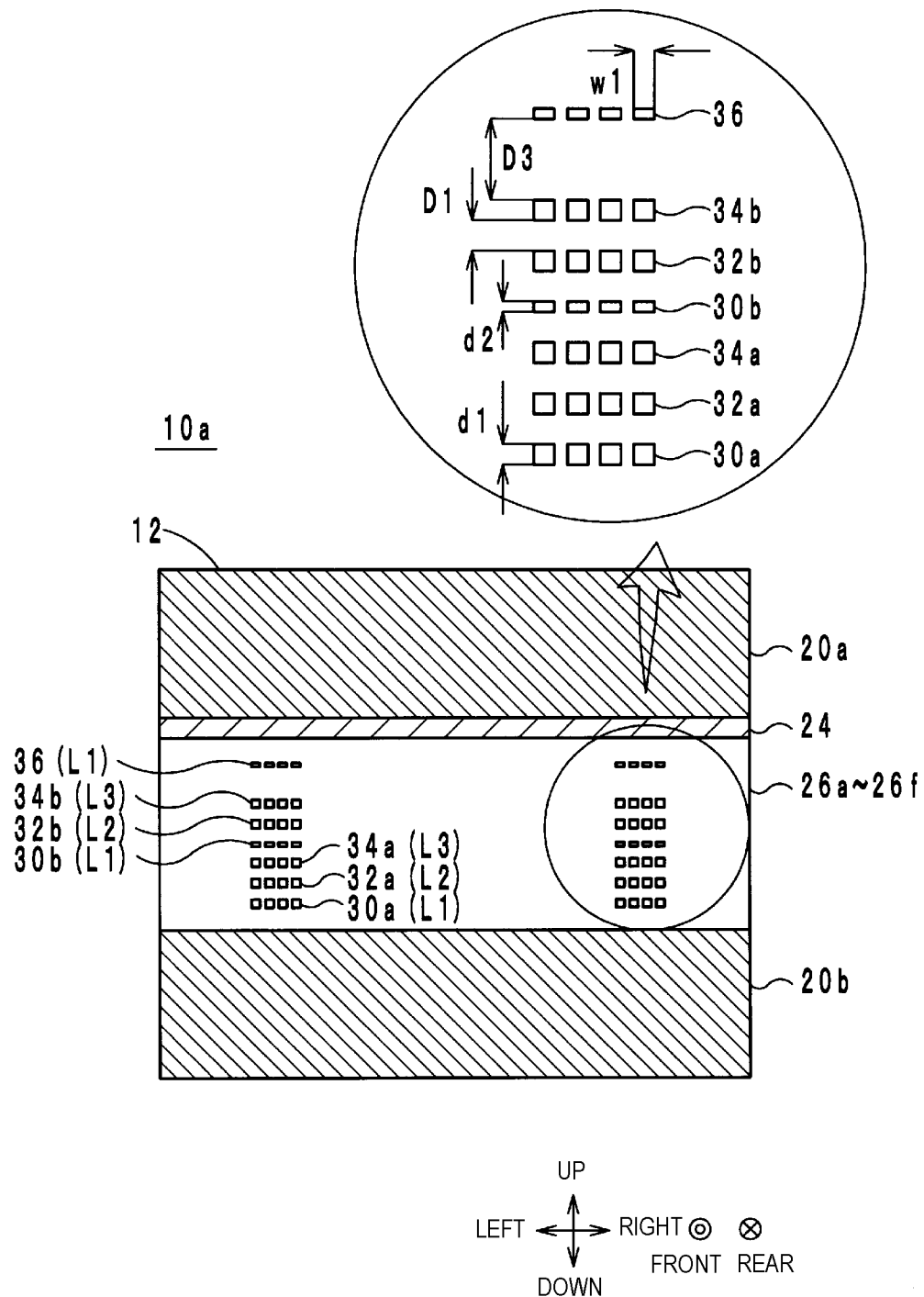
FIG. 8B is a sectional structural view, taken along 3-3, of the electronic component, illustrated in FIG. 1, according to the first modification.

A configuration of the electronic component 10a will be described in more detail below with reference to the drawings. FIG. 8A is an exploded perspective view of a multilayer body 22 of the electronic component 10a. In FIG. 8A, however, an insulator layer 26a is omitted. FIG. 8B is a sectional structural view, taken along 3-3, of the electronic component 10a illustrated in FIG. 1. FIG. 1 is further referenced for an external perspective view of the electronic component 10a.

Outer electrodes 14a to 14f, connecting portions 16a to 16f, magnetic substrates 20a and 20b, and a magnetic layer 24 of the electronic component 10a are similar to the outer electrodes 14a to 14f, the connecting portions 16a to 16f, the magnetic substrates 20a and 20b, and the magnetic layer 24 of the electronic component 10, respectively, and hence description of those members is omitted here.

The multilayer body 22 includes insulator layers 26a to 26h, and it has a substantially rectangular shape in the plan view. Shapes and materials of the insulator layers 26a to 26h in the electronic component 10a are similar to those of the insulator layers 26a to 26f in the electronic component 10, and hence description of the shapes and the materials thereof is omitted here. However, it is to be noted that the insulator layer 26b has a larger thickness than each of the insulator layers 26a and 26c to 26h.

The primary coil L1 is disposed inside the multilayer body 22 and includes the coil conductor layer 30a, the coil conductor layer 30b, and an interlayer connecting conductor v11. The coil conductor layer 30a in the electronic component 10a is similar to the coil conductor layer 30a in the electronic component 10 except for being disposed on the upper surface of the insulator layer 26h, and hence description of the coil conductor layer 32a is omitted here. A lead-out portion 50 in the electronic component 10a is similar to the lead-out portion in the electronic component 10 except that a lead-out conductor layer 40a is disposed on the upper surface of the insulator layer 26h, and hence description of the lead-out portion 50 is omitted here.

The coil conductor layer 30b is disposed on the upper surface of the insulator layer 26e, and it has a substantially spiral shape extending from the inner peripheral side toward the outer peripheral side while circling clockwise in the plan view. In this embodiment, the coil conductor layer 30b has a length corresponding to about four times the circumference of the spiral shape. The center of the coil conductor layer 30b is substantially aligned with the center (crossed point of diagonal lines) of the electronic component 10a in the plan view.

The interlayer connecting conductor v11 is a conductor penetrating through the insulator layers 26b to 26h in the up-down direction, and it has a substantially linear shape extending in the left-right direction in the plan view. The interlayer connecting conductor v11 is disposed in rear half regions of the insulator layers 26b to 26h in the plan view, and it connects an end portion of the coil conductor layer 30a on the inner peripheral side and an end portion of the coil conductor layer 30b on the inner peripheral side.

A lead-out portion 53' connects the other end of the primary coil L1 (i.e., an end portion of the coil conductor layer 30b on the outer peripheral side) to the outer electrode 14d, and it does not have the substantially spiral shape in the plan view, as illustrated in FIG. 8A. The lead-out portion 53' includes a lead-out conductor layer 40b and a connecting conductor 70d. The connecting conductor 70d is a conductor having a substantially triangular prism shape and disposed at rear right corners of the insulator layers 26b to 26h. The connecting conductor 70d extends in the up-down direction from the upper surface of the insulator layer 26b to the bottom surface of the insulator layer 26h, and is connected at its lower end to the connecting portion 16d.

The lead-out conductor layer 40b is disposed on the upper surface of the insulator layer 26e, and is connected to the end portion of the coil conductor layer 30b on the outer peripheral side and further to the connecting conductor 70d. The lead-out conductor layer 40b does not have the substantially spiral shape in the plan view, and it extends rightward from the end portion of the coil conductor layer 30b on the outer peripheral side. With such an arrangement, the other end of the primary coil L1 (i.e., the end portion of the coil conductor layer 30b on the outer peripheral side) and the outer electrode 14d are connected to each other through the lead-out portion 53' (including the lead-out conductor layer 40b and the connecting conductor 70d) and the connecting portion 16d.

The secondary coil L2 is disposed inside the multilayer body 22 and includes the coil conductor layer 32a, the coil conductor layer 32b, and an interlayer connecting conductor v12. The coil conductor layer 32a in the electronic component 10a is similar to the coil conductor layer 32a in the electronic component 10 except for being disposed on the upper surface of the insulator layer 26g, and hence description of the coil conductor layer 32a is omitted here. A lead-out portion 51 in the electronic component 10a is similar to the lead-out portion in the electronic component 10 except that a lead-out conductor layer 42a is disposed on the upper surface of the insulator layer 26g, and hence description of the lead-out portion 51 is omitted here.

The coil conductor layer 32b is disposed on the upper surface of the insulator layer 26d, and it has a substantially spiral shape extending from the inner peripheral side toward the outer peripheral side while circling clockwise in the plan view. In this embodiment, the coil conductor layer 32b has a length corresponding to about four times the circumference of the spiral shape. The center of the coil conductor layer 32b is substantially aligned with the center (crossed point of the diagonal lines) of the electronic component 10a in the plan view.

As illustrated in FIG. 8A, the coil conductor layer 32b overlaps the coil conductor layer 30b substantially over the entire length in the plan view. Therefore, the coil conductor layer 30b (i.e., the primary coil L1) and the coil conductor layer 32b (i.e., the secondary coil L2) are magnetically coupled to each other. However, positions of both ends of the coil conductor layer 30b and positions of both ends of the coil conductor layer 32b are set to be different such that the lead-out portions 50 and 53' and later-described lead-out portions 51 and 54' do not interfere with each other. More specifically, the end portion of the coil conductor layer 32b on the outer peripheral side is positioned downstream of the end portion of the coil conductor layer 30b on the outer peripheral side in the clockwise direction. The end portion of the coil conductor layer 32b on the inner peripheral side is positioned downstream of the end portion of the coil conductor layer 30b on the inner peripheral side in the clockwise direction. With such an arrangement, the length of the coil conductor layer 30b and the length of the coil conductor layer 32b are substantially equal to each other.

The interlayer connecting conductor v12 is a conductor penetrating through the insulator layers 26d to 26g in the up-down direction, and it has a substantially linear shape extending in the left-right direction in the plan view. The interlayer connecting conductor v12 is disposed in central regions of the insulator layers 26d to 26g in the plan view, and it connects the end portion of the coil conductor layer 32a on the inner peripheral side and the end portion of the coil conductor layer 32b on the inner peripheral side.

A lead-out portion 54' connects the other end of the secondary coil L2 (i.e., an end portion of the coil conductor layer 32b on the outer peripheral side) to the outer electrode 14e, and it does not have the substantially spiral shape in the plan view, as illustrated in FIG. 8A. The lead-out portion 54' includes a lead-out conductor layer 42b and a connecting conductor 70e. The connecting conductor 70e is a conductor having a substantially quadrangular prism shape and is disposed at the middle of the long sides of the insulator layers 26b to 26h on the right side. The connecting conductor 70e extends in the up-down direction from the upper surface of the insulator layer 26b to the bottom surface of the insulator layer 26h, and is connected at its lower end to the connecting portion 16e.

The lead-out conductor layer 42b is disposed on the upper surface of the insulator layer 26d, and is connected to the end portion of the coil conductor layer 32b on the outer peripheral side and further to the connecting conductor 70e. The lead-out conductor layer 42b does not have the substantially spiral shape in the plan view, and it extends rightward from the end portion of the coil conductor layer 32b on the outer peripheral side. With such an arrangement, the other end of the secondary coil L2 (i.e., the end portion of the coil conductor layer 32b on the outer peripheral side) and the outer electrode 14e are connected to each other through the lead-out portion 54' (including the lead-out conductor layer 42b and the connecting conductor 70e) and the connecting portion 16e.

The tertiary coil L3 is disposed inside the multilayer body 22 and includes the coil conductor layer 34a, the coil conductor layer 34b, and an interlayer connecting conductor v13. The coil conductor layer 34a in the electronic component 10a is similar to the coil conductor layer 34a in the electronic component 10 except for being disposed on the upper surface of the insulator layer 26f, and hence description of the coil conductor layer 34a is omitted here. A lead-out portion 52 in the electronic component 10a is similar to the lead-out portion in the electronic component 10 except that a lead-out conductor layer 44a is disposed on the upper surface of the insulator layer 26f, and hence description of the lead-out portion 52 is omitted here.

The coil conductor layer 34b is disposed on the upper surface of the insulator layer 26c, and it has a substantially spiral shape extending from the inner peripheral side toward the outer peripheral side while circling clockwise in the plan view. In this embodiment, the coil conductor layer 34b has a length corresponding to about four times the circumference of the spiral shape. The center of the coil conductor layer 34b is substantially aligned with the center (crossed point of the diagonal lines) of the electronic component 10a in the plan view.

As illustrated in FIG. 8A, the coil conductor layer 34b overlaps the coil conductor layers 30b and 32b substantially over the entire length in the plan view. Therefore, the coil conductor layer 30b (i.e., the primary coil L1), the coil conductor layer 32b (i.e., the secondary coil L2) and the coil conductor layer 34b (i.e., the tertiary coil L3) are magnetically coupled to one another. However, positions of both ends of the coil conductor layer 30b, positions of both ends of the coil conductor layer 32b, and positions of both ends of the coil conductor layer 34b are set to be different such that the lead-out portions 50 and 53', the lead-out portions 51 and 54', and lead-out portions 52 and 55' do not interfere with one another. More specifically, the end portion of the coil conductor layer 34b on the outer peripheral side is positioned downstream of the end portions of the coil conductor layers 30b and 32b on the outer peripheral side in the clockwise direction. The end portion of the coil conductor layer 34b on the inner peripheral side is positioned downstream of the end portions of the coil conductor layers 30b and 32b on the inner peripheral side in the clockwise direction. With such an arrangement, the length of the coil conductor layer 30b, the length of the coil conductor layer 32b, and the length of the coil conductor layer 34b are substantially equal to one another.

The interlayer connecting conductor v13 is a conductor penetrating through the insulator layers 26c to 26f in the up-down direction, and it has a substantially linear shape extending in the left-right direction in the plan view. The interlayer connecting conductor v13 is disposed in front half regions of the insulator layers 26c to 26f in the plan view, and it connects the end portion of the coil conductor layer 34a on the inner peripheral side and the end portion of the coil conductor layer 34b on the inner peripheral side.

A lead-out portion 55' connects the other end of the tertiary coil L3 (i.e., an end portion of the coil conductor layer 34b on the outer peripheral side) to the outer electrode 14f, and it does not have the substantially spiral shape in the plan view, as illustrated in FIG. 8A. The lead-out portion 55' includes a lead-out conductor layer 44b and a connecting conductor 70f. The connecting conductor 70f is a conductor having a substantially triangular prism shape and disposed at front right corners of the insulator layers 26b to 26h. The connecting conductor 70f extends in the up-down direction from the upper surface of the insulator layer 26b to the bottom surface of the insulator layer 26h, and is connected at its lower end to the connecting portion 16f.

The lead-out conductor layer 44b is disposed on the upper surface of the insulator layer 26c, and is connected to the end portion of the coil conductor layer 34b on the outer peripheral side and further to the connecting conductor 70f. The lead-out conductor layer 44b does not have the substantially spiral shape in the plan view, and it extends forward from the end portion of the coil conductor layer 34b on the outer peripheral side. With such an arrangement, the other end of the tertiary coil L3 (i.e., the end portion of the coil conductor layer 34b on the outer peripheral side) and the outer electrode 14f are connected to each other through the lead-out portion 55' (including the lead-out conductor layer 44b and the connecting conductor 70f) and the connecting portion 16f.

The primary coil L1 further includes a parallel coil conductor layer 36, one example of the parallel primary coil conductor layer. The parallel coil conductor layer 36 has the same shape as the coil conductor layer 30b. The parallel coil conductor layer 36 is electrically connected to the coil conductor layer 30b in parallel, and is disposed on the upper side of the coil conductor layer 34b that is disposed at an uppermost position among the coil conductor layers 30a, 32a, 34a, 30b, 32b and 34b. The parallel coil conductor layer 36 is disposed on the upper surface of the insulator layer 26b, and has a substantially spiral shape extending from the inner peripheral side toward the outer peripheral side while circling clockwise in the plan view. In this embodiment, the parallel coil conductor layer 36 has a length corresponding to about four times the circumference of the spiral shape. The center of the parallel coil conductor layer 36 is substantially aligned with the center (crossed point of the diagonal lines) of the electronic component 10a in the plan view.

An end portion of the parallel coil conductor layer 36 on the inner peripheral side is connected to the end portions of the coil conductor layers 30a and 30b on the inner peripheral side through the interlayer connecting conductor v11.

A lead-out portion 56' connects an end portion of the parallel coil conductor layer 36 on the outer peripheral side to the outer electrode 14d, and it does not have the substantially spiral shape in the plan view, as illustrated in FIG. 8A. The lead-out portion 56' includes a lead-out conductor layer 46' and the connecting conductor 70d. The lead-out conductor layer 46' is disposed on the upper surface of the insulator layer 26b, and is connected to the end portion of the parallel coil conductor layer 36 on the outer peripheral side and further to the connecting conductor 70d. The lead-out conductor layer 46' does not have the substantially spiral shape in the plan view, and it extends rightward from the end portion of the parallel coil conductor layer 36 on the outer peripheral side. With such an arrangement, the end portion of the parallel coil conductor layer 36 on the outer peripheral side and the outer electrode 14d are connected to each other through the lead-out portion 56' (including the lead-out conductor layer 46' and the connecting conductor 70d) and the connecting portion 16d. Thus, the parallel coil conductor layer 36 is electrically connected to the coil conductor layer 30b in parallel.

As illustrated in FIG. 8B, respective line widths of the coil conductor layers 30a, 32a, 34a, 30b, 32b and 34b and a line width of the parallel coil conductor layer 36 are substantially equal to one another as denoted by a line width w1. However, each of the coil conductor layers 30a, 32a, 34a, 32b and 34b has a thickness d1, and each of the coil conductor layer 30b and the parallel coil conductor layer 36 has a thickness d2. The thickness d2 is about a half of the thickness d1. Accordingly, a total of a sectional area of the coil conductor layer 30b, one example of a predetermined primary coil conductor layer, and a sectional area of the parallel coil conductor layer 36 is substantially equal to a sectional area of the coil conductor layer 30a, one example of each of the primary coil conductor layers other than the predetermined primary coil conductor layer, a sectional area of each of the coil conductor layers 32a and 32b, and a sectional area of each of the coil conductor layers 34a and 34b.

Moreover, thicknesses of the insulator layers 26a and 26c to 26h are even. Therefore, intervals D1 between two coil conductor layers among the coil conductor layers 30a, 32a, 34a, 30b, 32b and 34b, every two of those being adjacent to each other in the up-down direction, are substantially the same. However, the insulator layer 26b has a larger thickness than each of the insulator layers 26a and 26c to 26h. Accordingly, an interval D3 between the parallel coil conductor layer 36 and the coil conductor layer 34b is larger than the interval D1 between every two among the coil conductor layers 30a, 32a, 34a, 30b, 32b and 34b adjacent to each other in the up-down direction.

The electronic component 10a having the above-described configuration can also provide similar advantageous effects to those obtained with the electronic component 10. Stated in another way, the configuration providing uneven intervals between adjacent two insulator layers among the insulator layers may be implemented by inserting the lead-out conductor layer as in the electronic component 10, or by changing the thickness of the insulator layer as in the electronic component 10a.

In the electronic component 10a, a higher inductance value can be obtained for the following reason. The reason is described by taking the primary coil L1 as an example. The primary coil L1 includes the coil conductor layers 30a and 30b and the interlayer connecting conductor v11. The coil conductor layer 30a has the substantially spiral shape extending from the outer peripheral side toward the inner peripheral side while circling clockwise. The coil conductor layer 30b has the substantially spiral shape extending from the inner peripheral side toward the outer peripheral side while circling clockwise. The interlayer connecting conductor v11 connects the end portion of the coil conductor layer 30a on the inner peripheral side and the end portion of the coil conductor layer 30b on the inner peripheral side. Thus, since the primary coil L1 of the electronic component 10a is constituted by the two coil conductor layers 30a and 30b connected in series, it has a higher inductance value than the primary coil L1 of the electronic component 10.

Furthermore, in the electronic component 10a, the lead-out conductor layers 60, 62 and 64 are no longer required. The reason is described by taking the primary coil L1 as an example. The end portion of the coil conductor layer 30a on the inner peripheral side and the end portion of the coil conductor layer 30b on the inner peripheral side are connected by the interlayer connecting conductor v11. The end portion of the coil conductor layer 30a on the outer peripheral side is connected to the connecting conductor 70a through the lead-out conductor layer 40a that is disposed on the insulator layer 26h on which the coil conductor layer 30a is also disposed. The end portion of the coil conductor layer 30b on the outer peripheral side is connected to the connecting conductor 70d through the lead-out conductor layer 40b that is disposed on the insulator layer 26e on which the coil conductor layer 30b is also disposed. Accordingly, the lead-out conductor layer 60, which is disposed in the electronic component 10 on the insulator layer 26b different from the insulator layers 26e and 26h, is no longer required in the electronic component 10a.

While the electronic component 10a has been described above as including the two coil conductor layer groups Ga and Gb, it may include more than two coil conductor layer groups. The following description is made in connection with the case where the electronic component 10a includes n coil conductor layer groups Ga, Gb, etc. n is a natural number.

When the electronic component 10a includes n coil conductor layer groups Ga, Gb, etc., the primary coil L1 includes n coil conductor layers 30a, 30b, etc. and the parallel coil conductor layer 36, the secondary coil L2 includes n coil conductor layers 32a, 32b, etc., and the tertiary coil L3 includes n coil conductor layers 34a, 34b, etc. The coil conductor layer 30a, 32a and 34a are arrayed one by one in the mentioned order from the lower side toward the upper side and constitute a coil conductor layer group Ga. The coil conductor layer 30b, 32b and 34b are arrayed one by one in the mentioned order from the lower side toward the upper side and constitute a coil conductor layer group Gb. The other coil conductor layer groups subsequent to the coil conductor layer group Gc are also each constituted similarly to the coil conductor layer groups Ga and Gb. The n coil conductor layer groups Ga, Gb, etc. are arrayed in the mentioned order from the lower side toward the upper side.

The parallel coil conductor layer 36 has the same shape as a predetermined coil conductor layer, one example of a predetermined primary coil conductor layer, among the n coil conductor layers 30a, 30b, etc., and it is electrically connected to the predetermined one among the number n of coil conductor layers 30a, 30b, etc. in parallel. In addition, the parallel coil conductor layer 36 is disposed on the upper side of the coil conductor layer (one example of the predetermined tertiary coil conductor layer), which is disposed at an uppermost position among the n coil conductor layers 34a, 34b, etc.

An interval in the up-down direction between the parallel coil conductor layer 36 and the coil conductor layer, which is disposed at the uppermost position among the n coil conductor layers 34a, 34b, etc., is larger than an interval between every two among the n coil conductor layers 30a, 30b, etc., among the n coil conductor layers 32a, 32b, etc., and among the n coil conductor layers 34a, 34b, etc., the two being adjacent to each other in the up-down direction.

The following description is made in connection with the case where n is an even number. In this case, the n coil conductor layers 30a, 30b, etc. in the primary coil L1 includes n/2 coil conductor layers 30a, 30c, 30e, etc. each of which has a substantially spiral shape extending from the outer peripheral side toward the inner peripheral side while circling clockwise in the plan view, and the n/2 coil conductor layers 30b, 30d, 30f, etc. each of which has a substantially spiral shape extending from the inner peripheral side toward the outer peripheral side while circling clockwise in the plan view. The primary coil L1 is constituted by alternately electrically connecting the n/2 coil conductor layers 30a, 30c, 30e, etc. and the n/2 coil conductor layers 30b, 30d, 30f, etc. in series. With such an arrangement, the lead-out conductor layer 60 is no longer required.

(Second Modification)

Figure 9:
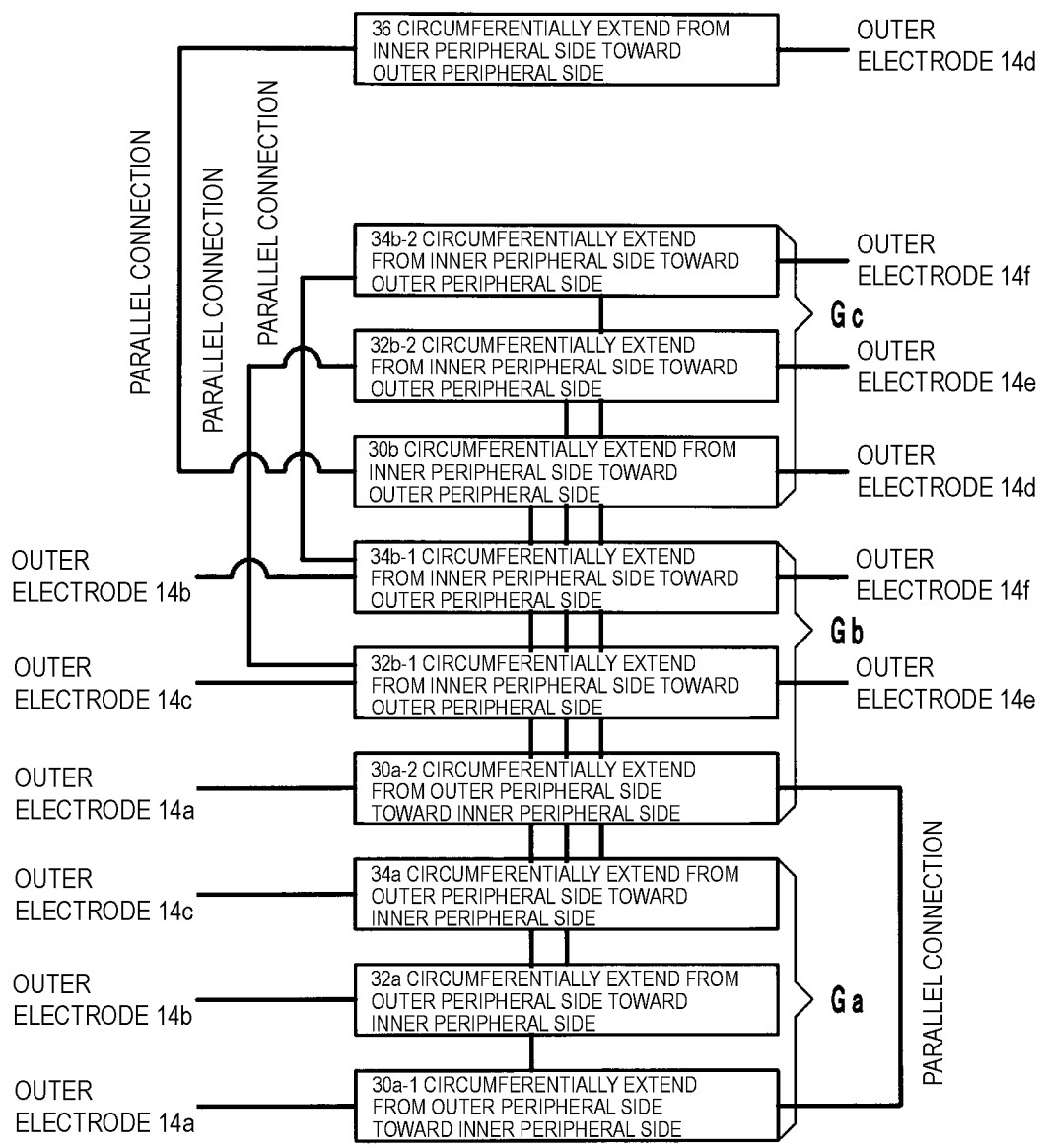
FIG. 9 is a schematic view illustrating a positional relationship among coil conductor layers and a parallel coil conductor layer of the electronic component according to the second modification.

A configuration of an electronic component 10b according to a second modification will be described below with reference to the drawings. FIG. 9 is a schematic view illustrating a positional relation among coil conductor layers 30a-1, 30a-2, 32a, 34a, 30b, 32b-1, 32b-2, 34b-1 and 34b-2 and a parallel coil conductor layer 36 of the electronic component 10b.

In the electronic component 10a, as illustrated in FIG. 7B, the coil conductor layer 30b and the parallel coil conductor layer 36 are electrically connected in parallel. On the other hand, in the electronic component 10b, as illustrated in FIG. 9, the coil conductor layer 30a-1 and the coil conductor layer 30a-2 are electrically connected in parallel, the coil conductor layer 32b-1 and the coil conductor layer 32b-2 are electrically connected in parallel, and the coil conductor layer 34b-1 and the coil conductor layer 34b-2 are electrically connected in parallel. Thus, the coil conductor layers may be connected in parallel at a plurality of locations.

(Third Modification)

Figure 10:
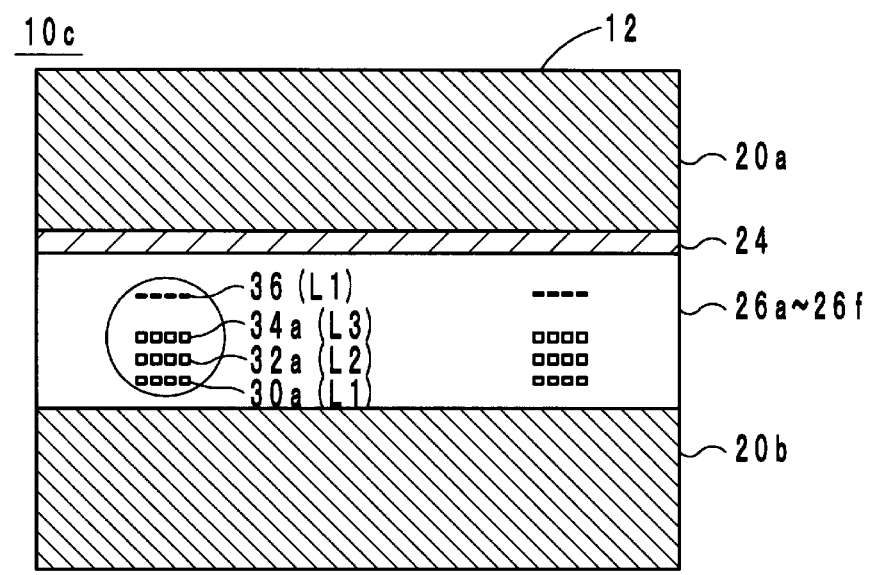
FIG. 10 is a sectional structural view, taken along 3-3, of the electronic component, illustrated in FIG. 1, according to the third modification.
Figure 10:
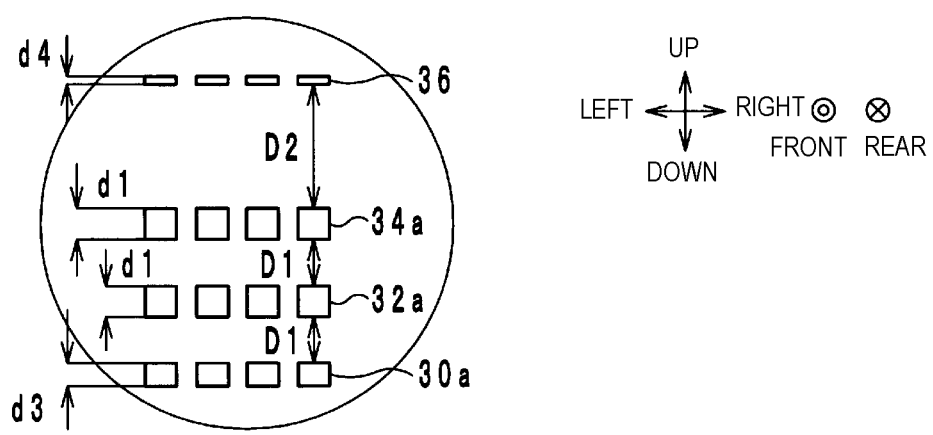

A configuration of an electronic component 10c according to a third modification will be described below with reference to the drawings. FIG. 10 is a sectional structural view, taken along 3-3, of the electronic component 10c illustrated in FIG. 1. FIGS. 1 and 2 are further referenced for an external perspective view and an exploded perspective view of the electronic component 10c.

The electronic component 10c is different from the electronic component 10 in the thicknesses of the coil conductor layers 30a, 32a and 34a and the parallel coil conductor layer 36. To explain in more detail, in the electronic component 10, as illustrated in FIG. 3, each of the coil conductor layer 30a and the parallel coil conductor layer 36 has the thickness d2, and each of the coil conductor layers 32a and 34a has the thickness d1. The thickness d2 is about half of the thickness d1. As a result, the total of the sectional area of the coil conductor layer 30a and the sectional area of the parallel coil conductor layer 36 is substantially equal to the sectional area of the coil conductor layer 32a and the sectional area of the coil conductor layer 34a.

On the other hand, in the electronic component 10c, as illustrated in FIG. 10, each of the coil conductor layer 32a and the coil conductor layer 34a has the thickness d1, the coil conductor layer 30a has a thickness d3, and the parallel coil conductor layer 36 has a thickness d4. In FIG. 10, the thickness d4 is about ⅓ of the thickness d3. Thus, the thickness of the coil conductor layer 30a and the thickness of the parallel coil conductor layer 36 may be different from each other. However, a total of the thickness d3 and the thickness d4 is substantially equal to the thickness d1. As a result, the total of the sectional area of the coil conductor layer 30a and the sectional area of the parallel coil conductor layer 36 is substantially equal to the sectional area of the coil conductor layer 32a and the sectional area of the coil conductor layer 34a.

The electronic component 10c having the above-described configuration can also provide similar advantageous effects to those obtained with the electronic component 10.

It is to be noted that, in the electronic component 10c, the thickness d4 may be larger than the thickness d3.

(Fourth Modification)

Figure 11:
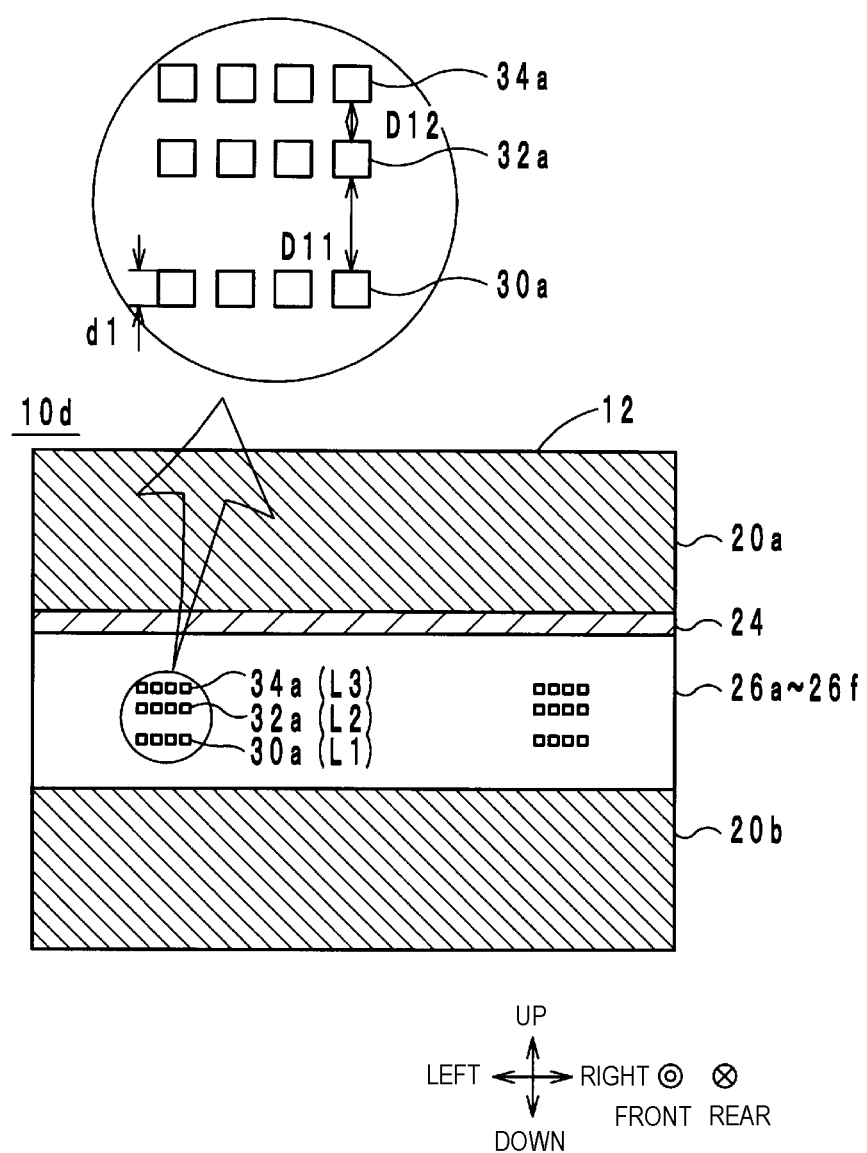
FIG. 11 is a sectional structural view, taken along 3-3, of the electronic component, illustrated in FIG. 1, according to the fourth modification.
Figure 12:
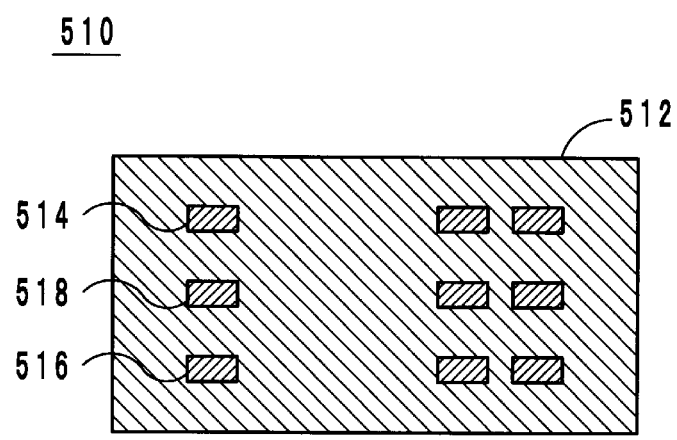
FIG. 12 is a sectional structural view of a common mode choke coil disclosed in Japanese Patent No. 4209851.

A configuration of an electronic component 10d according to a fourth modification will be described below with reference to the drawings. FIG. 11 is a sectional structural view, taken along 3-3, of the electronic component 10d illustrated in FIG. 1. FIG. 1 is further referenced for an external perspective view of the electronic component 10d.

The electronic component 10d is different from the electronic component 10 in that the parallel coil conductor layer 36 is not disposed, and the interval between the coil conductor layer 30a and the coil conductor layer 32a is different from the interval between the coil conductor layer 32a and the coil conductor layer 34a.

The coil conductor layers 30a, 32a and 34a are arrayed to position in the mentioned order from the lower side toward the upper side and are magnetically coupled to constitute a common mode filter. Intervals between two of the coil conductor layer 30a, the coil conductor layer 32a, and the coil conductor layer 34a, every two of those being adjacent to each other in the up-down direction, are not even. In the electronic component 10d, an interval D11 between the coil conductor layer 30a and the coil conductor layer 32a is larger than an interval D12 between the coil conductor layer 32a and the coil conductor layer 34a.

In the electronic component 10, the parallel coil conductor layer 36 is disposed to make the differential impedance I31 closer to the differential impedance I12 and the differential impedance I23. The interval D2 between the coil conductor layer 34a and the parallel coil conductor layer 36 is larger than the interval D1 between the coil conductor layer 30a and the coil conductor layer 32a and the interval D1 between the coil conductor layer 32a and the coil conductor layer 34a. As a result, the differential impedance I31 is slightly larger than each of the differential impedances I12 and I23.

On the other hand, in the electronic component 10d, since the parallel coil conductor layer 36 is not disposed, the differential impedance I12, the differential impedance I23, and the differential impedance I31 are not made closer to one another unlike the electronic component 10. Thus, the differential impedance I31 is larger than each of the differential impedances I12 and I23. In such a state, the interval D11 between the coil conductor layer 30a and the coil conductor layer 32a is larger than the interval D12 between the coil conductor layer 32a and the coil conductor layer 34a. Therefore, the differential impedance I12 is larger than the differential impedance I23. As a result, the differential impedance I31 is maximal, and the differential impedance I23 is minimal.

Figure 13:
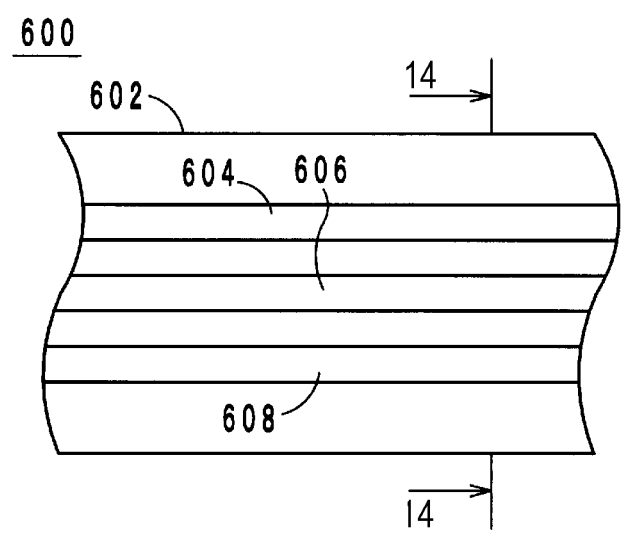
FIG. 13 is a plan view of a circuit board to which the common mode choke coil is mounted.
Figure 14:
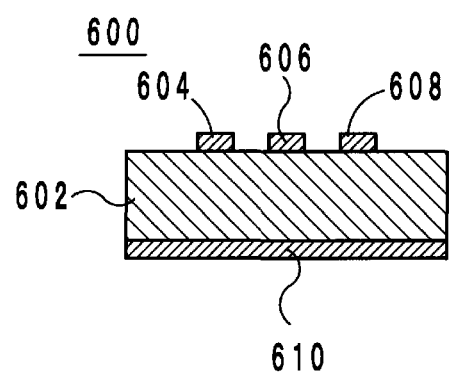
FIG. 14 is a sectional structural view, taken along 14-14 in FIG. 13, of the circuit board to which the common mode choke coil is mounted.

Thus, in the electronic component 10d, the parallel coil conductor layer 36 is not essential. To explain in more detail, in the circuit board 600 illustrated in FIG. 13, the differential impedance between the signal line 604 and the signal line 608 is larger than the differential impedance between the signal line 604 and the signal line 606 and the differential impedance between the signal line 606 and the signal line 608. Depending on structures of the circuit board 600, however, there is a case, for example, that the differential impedance between the signal line 604 and the signal line 608 is maximal and the differential impedance between the signal line 606 and the signal line 608 is minimal. In the circuit board 600 of that type, matching of the differential impedance is held by mounting the electronic component 10d.

Depending on structures of the circuit board 600, the interval D11 between the coil conductor layer 30a and the coil conductor layer 32a may be smaller than the interval D12 between the coil conductor layer 32a and the coil conductor layer 34a.

(Other Embodiments)

Embodiments of the electronic component according to the present disclosure are not limited to the electronic components 10 and 10a to 10d, and the electronic component may be modified within the scope not departing from the gist of the present disclosure.

The configurations of the electronic components 10 and 10a to 10d may be optionally combined with one another.

In the electronic component 10, the coil conductor layer 30a and the parallel coil conductor layer 36 are electrically connected in parallel through the connecting conductors 70a and 70d, the lead-out conductor layer 60, and the interlayer connecting conductor v1. As an alternative, the coil conductor layer 30a and the parallel coil conductor layer 36 may be electrically connected in parallel through only an interlayer connecting conductor, or through a combination of the connecting conductors 70a and 70d and a connecting conductor layer without using any interlayer connecting conductor. The above point is similarly applied to the electrical parallel connection with respect to the other coil conductor layers and the parallel coil conductor layer.

In the electronic component 10a, as illustrated in FIG. 8B, each of the coil conductor layers 30a, 32a, 32b, 34a and 34b has the thickness d1, and each of the coil conductor layer 30b and the parallel coil conductor layer 36 has the thickness d2. The thickness d1 is larger than the thickness d2. However, the thickness of each of the coil conductor layers 30a, 30b, 32a, 32b, 34a and 34b and the thickness of the parallel coil conductor layer 36 are not limited to the above-described relation. For example, the thickness of each of the coil conductor layers 30a and 30b and the thickness of the parallel coil conductor layer 36 may be substantially equal to each other. In that case, the thickness of each of the coil conductor layers 30a and 30b and the thickness of the parallel coil conductor layer 36 are preferably designed, for example, such that a conductor volume of the primary coil L1, a conductor volume of the secondary coil L2, and a conductor volume of the tertiary coil L3 are substantially equal to one another. Thus, the thickness of each of the coil conductor layers 30a and 30b and the thickness of the parallel coil conductor layer 36 are set to about ⅔ of the thickness of each of the coil conductor layers 32a, 32b, 34a and 34b. In the above case, since conditions in laminating the coil conductor layers 30a and 30b and the parallel coil conductor layer 36 are the same, it is possible to reduce stress concentration caused by the difference in the layer thickness, to improve reliability, and to rationalize the manufacturing steps.

While the electronic components 10 and 10a to 10d are fabricated by photolithography in the above embodiments, they may be fabricated, for example, by a lamination technique of laminating insulator layers on which the coil conductor layers are printed.

One example in which the intervals between two of the coil conductor layers 30a, 30b, 32a, 32b, 34a and 34b and the parallel coil conductor layer 36, every two of those being adjacent to each other in the up-down direction, are not even has been described above as an example in which, like the electronic component 10a of FIG. 8B, the interval between the coil conductor layer 34b and the parallel coil conductor layer 36 is larger than the intervals between two coil conductor layers among the coil conductor layers 30a, 30b, 32a, 32b and 34a, every two of those being adjacent to each other in the up-down direction. In the electronic component 10a, the intervals between two coil conductor layers among the coil conductor layers 30a, 30b, 32a, 32b and 34a, every two of those being adjacent to each other in the up-down direction, are all substantially equal to one another. However, at least one or more of the intervals between two coil conductor layers among the coil conductor layers 30a, 30b, 32a, 32b and 34a, every two being adjacent to each other in the up-down direction, may be different from the other interval(s), or the intervals between two coil conductor layers among the coil conductor layers 30a, 30b, 32a, 32b and 34a, every two of those being adjacent to each other in the up-down direction, may be all different from one another. Even with the configurations described above, matching of the differential impedance can be held in some cases depending on layouts of the signal lines 604, 606 and 608 in the circuit board 600. In one concrete example of those layouts, the interval between the signal line 604 and the signal line 606 is different from the interval between the signal line 606 and the signal line 608.

While, in the electronic component 10a, the parallel coil conductor layer 36 is connected to the coil conductor layer 30b in parallel, the parallel coil conductor layer 36 may be, as another example, connected to the coil conductor layer 30a in parallel.

As described above, the present disclosure is usefully applied to electronic components. In particular, the present disclosure is superior in a point that, in an electronic component including a common mode filter constituted by three coils, differential impedances between two among those coils can be adjusted.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
a multilayer body constituted by insulator layers that are laminated in a laminating direction;
a primary coil including one or more primary coil conductor layers and at least one parallel coil conductor layer, each disposed on one of the insulator layers;
a secondary coil including one or more secondary coil conductor layers each disposed on one of the insulator layers; and
a tertiary coil including one or more tertiary coil conductor layers each disposed on one of the insulator layers,
wherein the primary coil conductor layers, the secondary coil conductor layers, the tertiary coil conductor layers, and at least one parallel coil conductor layer are arrayed in the laminating direction such that every two coil conductor layers are adjacent to each other with an interval therebetween in the laminating direction,
the primary coil, the secondary coil, and tertiary coil constitute a common mode filter, and
an interval between the at least one parallel coil conductor layer and the tertiary coil layers is different from the respective other intervals.

2. The electronic component according to claim 1, wherein n is a natural number,
the one or more primary coil conductor layers include n primary coil conductor layers and a parallel primary coil conductor layer disposed on one of the insulator layers,
the one or more secondary coil conductor layers include n secondary coil conductor layers,
the one or more tertiary coil conductor layers include n tertiary coil conductor layers,
current paths of the primary coil, the secondary coil, and the tertiary coil are substantially equal to one another in length,
respective ones of the primary coil conductor layers, the secondary coil conductor layers, and the tertiary coil conductor layers are arrayed in a mentioned order from one side toward the other side in the laminating direction and constitute a coil conductor layer group,
n coil conductor layer groups are arrayed from the one side toward the other side in the laminating direction,
the parallel primary coil conductor layer is electrically connected to a predetermined primary coil conductor layer in parallel, has a substantially same shape as the predetermined primary coil conductor layer in a plan view which is a one viewed from the laminating direction, and is disposed on the other side in the laminating direction relative to a predetermined tertiary coil conductor layer which is the tertiary coil conductor layer disposed at a farthest position on the other side in the laminating direction, and
an interval in the laminating direction between the parallel primary coil conductor layer and the predetermined tertiary coil conductor layer is larger than respective intervals between two of the primary coil conductor layers, the secondary coil conductor layers, and the tertiary coil conductor layers.

3. The electronic component according to claim 2, wherein n is a natural number of two or more, a total of a sectional area of the predetermined primary coil conductor layer and a sectional area of the parallel primary coil conductor layer is substantially equal to a sectional area of each of the primary coil conductor layers other than the predetermined primary coil conductor layer.

4. The electronic component according to claim 2, wherein the sectional area of the predetermined primary coil conductor layer and the sectional area of the parallel primary coil conductor layer are substantially equal to each other.

5. The electronic component according to claim 2, wherein the total of the sectional area of the predetermined primary coil conductor layer and the sectional area of the parallel primary coil conductor layer is substantially equal to a sectional area of each of the secondary coil conductor layers, and is substantially equal to a sectional area of each of the tertiary coil conductor layers.

6. The electronic component according to claim 2, wherein a volume of the primary coil, a volume of the secondary coil, and a volume of the tertiary coil are substantially equal to one another.

7. The electronic component according to claim 2, wherein the respective intervals between two of the primary coil conductor layers, the secondary coil conductor layers, and the tertiary coil conductor layers are substantially even.

8. The electronic component according to claim 2, wherein each of the primary coil conductor layers has a substantially spiral shape in the plan view, and
the electronic component further comprises:
a first outer electrode; and
a first lead-out conductor layer not having a substantially spiral shape in the plan view,
wherein the primary coil conductor layers include an end primary coil conductor layer, and
the first lead-out conductor layer relays connection between an inner end portion of the end primary coil conductor layer and the first outer electrode, and is disposed between the parallel primary coil conductor layer and the predetermined tertiary coil conductor layer.

9. The electronic component according to claim 8, wherein each of the secondary coil conductor layers and the tertiary coil conductor layers has a substantially spiral shape in the plan view, and
the electronic component further comprising:
a second outer electrode;
a third outer electrode;
a second lead-out conductor layer not having a substantially spiral shape in the plan view; and
a third lead-out conductor layer not having a substantially spiral shape in the plan view, wherein
the secondary coil conductor layers include an end secondary coil conductor layer,
the tertiary coil conductor layers include an end tertiary coil conductor layer,
the second lead-out conductor layer relays connection between an inner end portion of the end secondary coil conductor layer and the second outer electrode, and is disposed between the parallel primary coil conductor layer and the predetermined tertiary coil conductor layer,
the third lead-out conductor layer relays connection between an inner end portion of the end tertiary coil conductor layer and the third outer electrode, and is disposed between the parallel primary coil conductor layer and the predetermined tertiary coil conductor layer, and
the first outer electrode, the second outer electrode, and the third outer electrode are arrayed in a mentioned order in a predetermined direction that is perpendicular to the laminating direction.

* * * * *